US008138537B2

(12) United States Patent
Sato

(10) Patent No.: US 8,138,537 B2
(45) Date of Patent: Mar. 20, 2012

(54) SEMICONDUCTOR DEVICE WITH GROOVED CAPACITOR STRUCTURE

(75) Inventor: Akihiko Sato, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 42 days.

(21) Appl. No.: 12/843,843

(22) Filed: Jul. 26, 2010

(65) Prior Publication Data
US 2010/0289120 A1 Nov. 18, 2010

Related U.S. Application Data

(62) Division of application No. 12/239,890, filed on Sep. 29, 2008, now Pat. No. 7,968,924.

(30) Foreign Application Priority Data

Oct. 5, 2007 (JP) ................................ 2007-262059

(51) Int. Cl.
*H01L 21/02* (2006.01)
*H01L 21/8239* (2006.01)
*H01L 27/105* (2006.01)
*H01L 29/92* (2006.01)
(52) U.S. Cl. ................. 257/296; 257/532; 257/E27.081; 257/E21.008; 257/E21.625; 257/E29.343; 438/239; 438/396
(58) Field of Classification Search ........... 257/296–313
See application file for complete search history.

(56) References Cited

U.S. PATENT DOCUMENTS

| 7,018,890 | B2 | 3/2006 | Tamura | |
|---|---|---|---|---|
| 7,371,631 | B2 | 5/2008 | Sakai et al. | |
| 2001/0054736 | A1* | 12/2001 | Ishige | 257/314 |
| 2007/0117340 | A1* | 5/2007 | Steltenpohl | 438/397 |

FOREIGN PATENT DOCUMENTS

| JP | 2003-60042 A | 2/2003 |
|---|---|---|
| JP | 2003-204003 A | 7/2003 |
| JP | 2006-019373 A | 1/2006 |

* cited by examiner

*Primary Examiner* — Ha Tran T Nguyen
*Assistant Examiner* — Raj R Gupta
(74) *Attorney, Agent, or Firm* — Miles and Stockbridge P.C.

(57) ABSTRACT

In a semiconductor device comprising a capacitive element, an area of the capacitive element is reduced without impairing performance, and further, without addition of an extra step in a manufacturing process. A first capacitor is formed between an active region of a semiconductor substrate provided through a first capacitive insulating film and a lower electrode comprised of a conductor film in the same layer as a select gate electrode of a select, a second capacitor is formed between the lower electrode, and an upper electrode comprised of a conductor film in the same layer as a memory gate electrode of a memory, provided through the second capacitive insulating film in the same layer as the insulating films of a multi-layer structure, including a charge storage layer, and a stacking-type capacitive element is comprised of the first capacitor and the second capacitor, wherein a planar shape of the lower electrode is a grid-like shape having a plurality of lengths of linear conductor films each having a first width, formed along a first direction with a first interval provided therebetween, and a plurality of lengths of linear conductor films each having a second width, formed along a second direction (the direction intersecting the first direction) with a second interval provided therebetween.

5 Claims, 25 Drawing Sheets

FIG. 9(a) STACKING-TYPE CAPACITIVE ELEMENT C1

| | | FORMULA FOR WORKING OUT AN AREA OF 1 MICRON SQUARE | AN AREA OF 10 MICRON SQUARE (μm²) |
|---|---|---|---|
| A FIRST CAPACITIVE INSULATING FILM | LINE AND SPACE SECTIONS SIDE COMB | 0.7 × 0.1 × 4 | 28 |
| | LINE AND SPACE SECTIONS SIDEWALL | 0.3 × 1 | 30 |
| A SECOND CAPACITIVE INSULATING FILM | SIDE COMB | 0.7 × 0.1 × 4 | 28 |
| | SIDEWALL | 0.3 × 1 | 30 |
| | | 0.25 × (0.7 + 0.15) × 2 × 4 | 170 |
| TOTAL AREA | | | 286 |

FIG. 9(b) SINGLE-LAYER CAPACITIVE ELEMENT

| | FORMULA FOR WORKING OUT AN AREA OF 10 MICRON SQUARE | AN AREA OF 10 MICRON SQUARE (μm²) |
|---|---|---|
| A FIRST CAPACITIVE INSULATING FILM | 10 × 10 | 100 |
| TOTAL AREA | | 100 |

FIG. 9(c) STACKING-TYPE CAPACITIVE ELEMENT C4

| | FORMULA FOR WORKING OUT AN AREA OF 1 MICRON SQUARE | AN AREA OF 10 MICRON SQUARE (μm²) |
|---|---|---|
| A FIRST CAPACITIVE INSULATING FILM | 10 × 10 | 100 |
| A SECOND CAPACITIVE INSULATING FILM | (10.4 + 0.25 × 2) × 10 | 109 |
| TOTAL AREA | | 209 |

SEMICONDUCTOR DEVICE WITH GROOVED CAPACITOR STRUCTURE

CROSS-REFERENCE TO RELATED APPLICATIONS

This application is a division of Application Ser. No. 12/239,890 filed Sep. 29, 2008 now U.S. Pat. No. 7,968,924. Also, the disclosure of Japanese Patent Application No. 2007-262059 filed on Oct. 5, 2007 including the specification, drawings, and abstract is incorporated herein by reference in its entirety.

BACKGROUND OF THE INVENTION

The invention relates to a semiconductor device, and a method of manufacturing the same, and in particular, to a technology effective when applied to a semiconductor device with a nonvolatile memory mounted over the same silicon substrate where a logic semiconductor device is mounted.

For example, in Japanese Unexamined Patent Publication No. 2003-204003 (Patent Document 1), there has been disclosed a semiconductor integrated circuit memory comprising a boost circuit including a capacitive element comprised of a lower electrode, a capacitive insulating film, and an upper electrode, and nonvolatile memory cells. The lower electrode of the capacitive element is formed in a shape such that a surface area thereof is increased by working on the shape. Further, the lower electrode and the upper electrode of the capacitive element are formed in the step of forming a floating gate, and a control gate electrode of the nonvolatile memory cell, respectively.

Further, in Japanese Unexamined Patent Publication No. 2003-60042 (Patent Document 2), there has been disclosed a capacitive element wherein a semiconductor substrate is used as a first electrode, and second and third electrodes, each being made of polysilicon, are deposited over the first electrode. The capacitive element is structured such that a first capacitor is formed of the first electrode, and the second electrode while a second capacitor is formed of the second electrode, and the third electrode, thereby causing respective capacitances of the first and second capacitors to be directly decided.

Still further, in Japanese Unexamined Patent Publication No. 2006-019373 (Patent Document 3), there has been disclosed a split-gate MONOS memory cell having a gate electrode of a select type field effect transistor, and a gate electrode of a memory field effect transistor.
[Patent Document 1]
Japanese Unexamined Patent Publication No. 2003-204003
[Patent Document 2]
Japanese Unexamined Patent Publication No. 2003-60042
[Patent Document 3]
Japanese Unexamined Patent Publication No. 2006-019373

SUMMARY OF THE INVENTION

As described in Patent Document 1, it becomes possible to implement a semiconductor device having high performance by mounting the nonvolatile memory over the same silicon substrate where the logic semiconductor device is mounted. Those semiconductor devices, each serving as a built-in microcomputer, have been in widespread use in industrial machines, household appliances, automobile-mounted devices, and so forth. In general, a program required by the microcomputer is stored in the nonvolatile memory mounted therein to be read out whenever necessary so as to be put to use.

The microcomputer with the nonvolatile memory mounted therein requires a power supply circuit comprising a capacitive element large in occupied area, for generating a high voltage for write/erase operations by the nonvolatile memory, although unnecessary for the microcomputer alone. The power supply circuit occupies a large area of the microcomputer with the nonvolatile memory mounted therein. Accordingly, reduction in planar dimensions of the capacitive element for the power supply circuit is effective in reducing planar dimensions of the microcomputer with the nonvolatile memory mounted therein.

The inventor, et al. first reviewed the case where the lower electrode, capacitive insulating film, and upper electrode of the capacitive element are formed by use of the floating gate, memory capacitive insulating film, and the control gate electrode of the nonvolatile memory cell, as described in Patent Document 1 when forming a stacking type capacitive element disclosed in Patent Document 2.

FIG. 27 (a) is a plan view of principal parts of a stacking type capacitive element reviewed by the inventor, et al. (corresponding to a quarter of a plan view of the stacking type capacitive element in whole), and FIG. 27 (b) is a sectional view of the principal parts, taken on line E-E' in FIG. 27 (a).

As shown in FIGS. 27 (a), and 27 (b), with a stacking-type capacitive element C4, a first capacitive insulating film 52, a lower electrode 53 comprised of a conductor film in the same layer as a floating gate, a second capacitive insulating film 54, and an upper electrode 55 comprised of a conductor film in the same layer as a control gate electrode are formed so as to be sequentially deposited over an active region (a region indicted by net-like hatching in FIG. 27 (a)) surrounded by inter-device separation parts SGI of a silicon substrate 51. A first capacitor is formed between the silicon substrate 51, and the lower electrode 53 while a second capacitor is formed between the lower electrode 53 and the upper electrode 55, and the stacking type capacitive element C4 is formed by parallel-coupling the first capacitor to the second capacitor. Reference character CNT in FIG. 27 (a) indicates contact holes formed in a interlayer dielectric covering the stacking type capacitive element C4, reaching an outlet of the lower electrode 53, or the upper electrode 55, respectively.

By use of the stacking type capacitive element C4, it is possible to obtain capacitance greater by from 1.5 times to about twice than that in the case of a single-layer capacitive element without the use of the first capacitor to be formed between the lower electrode 53 and the silicon substrate 51, with planar dimensions in both cases being the same. Accordingly, in the case of using the stacking type capacitive element C4, the planar dimensions of the capacitive element for the power supply circuit can be rendered smaller than those in the case of using the single-layer capacitive element.

However, in order to achieve further reduction in the cost of a semiconductor device, the microcomputer with the nonvolatile memory mounted therein, further reduction in the planar dimensions of the capacitive element for the power supply circuit, mounted therein, is highly hoped for, and a capacitive element for the power supply circuit, capable of obtaining capacitance greater by, for example, not less than twice than that in the case of the single-layer capacitive element is required with the planar dimensions in both cases remaining the same.

It is therefore an object of the invention to provide a technology capable of reducing an area of a capacitive element without impairing performance, and further, without addition of an extra step in a manufacturing process in the case of a semiconductor device comprising the capacitive element.

Further, another object of the invention is to provide a technology effective particularly in the case of application to a capacitive element for a power supply circuit, mounted in a microcomputer with a nonvolatile memory mounted therein.

Furthermore, still another object of the invention is to provide a technology effective particularly in the case of forming a stacking-type capacitive element in the microcomputer with the nonvolatile memory using split-gate MONOS memory cells, mounted therein.

The above and other objects, novel features of the present invention will be apparent from the following description of the present specification in conjunction with the accompanying drawings.

Embodiments of the invention disclosed under the present application are broadly described as follows.

A semiconductor device according to one embodiment of the invention has inter-device separation parts formed in a semiconductor substrate, partitioning an active region of the semiconductor substrate, and a capacitive element formed over the semiconductor substrate. The capacitive element has a well formed in the active region, forming a first electrode of the capacitive element. Further, the capacitive element has a first capacitive insulating film formed over the well. Still further, the capacitive element has a second electrode formed over the first capacitive insulating film. Yet further, the capacitive element has a second capacitive insulating film formed over the second electrode. Further, the capacitive element has a third electrode formed over the second capacitive insulating film. Furthermore, a plurality of grooves, each having a first width in a first direction, are formed in the second electrode. Further, a portion of the second capacitive insulating film, and a portion of the third electrode are embedded in the interior of each of the grooves. Still further, the second electrode has a thickness greater in value than an interval between the grooves, in the first direction.

The present embodiment relates to a semiconductor device having: a nonvolatile memory cell using a split-gate MONOS memory cells, each comprised of a select field effect transistor, and a memory field effect transistor; and a capacitive element for a power supply circuit, both the nonvolatile memory cell, and the capacitive element being provided over the same semiconductor substrate. Further, a first capacitor is formed between an active region surrounded by inter-device separation parts of the semiconductor substrate, and a lower electrode comprised of a conductor film in the same layer as a select gate electrode of a select field effect transistor through an insulating film in the same layer as a gate insulating film of a high-voltage CMIS of a peripheral circuit. Further, a second capacitor is formed between the lower electrode, provided through an insulating film in the same layer as insulating films of a multi-layer structure, including a charge storage layer, and an upper electrode comprised of a conductor film in the same layer as a memory gate electrode of a memory field effect transistor. Furthermore, a stacking type capacitive element is formed by parallel-coupling the first capacitor to the second capacitor. Still further, a planar shape of the lower electrode is rendered grid-like such that a plurality of lengths of linear conductor films, each having a first width, are formed along a first direction with a first interval provided therebetween, and a plurality of lengths of linear conductor films, each having a second width, are formed along a second direction intersecting the first direction with a second interval provided therebetween.

Another embodiment of the invention relates to a method of manufacturing a semiconductor device having: a nonvolatile memory cell using a split-gate MONOS memory cells, each comprised of a select field effect transistor, and a memory field effect transistor; and a capacitive element for a power supply circuit, both the nonvolatile memory cell and the capacitive element being provided over the same semiconductor substrate. First, a lower electrode comprised of a conductor film in the same layer as a select gate electrode of a select field effect transistor over an active region of a semiconductor substrate through the intermediary of an insulating film in the same layer as a gate insulating film of a high-voltage CMIS of a peripheral circuit, thereby forming a first capacitor. Subsequently, an upper electrode comprised of a conductor film in the same layer as a memory gate electrode of a memory field effect transistor is formed over the lower electrode, through the intermediary of an insulating film in the same layer as insulating films of a multi-layer structure, including a charge storage layer, thereby forming a second capacitor. Thereafter, the first capacitor is parallel-coupled to the second capacitor, thereby forming a stacking type capacitive element. Thereafter, a planar shape of the lower electrode is rendered grid-like such that a plurality of lengths of linear conductor films, each having a first width, are formed along a first direction with a first interval provided therebetween, and a plurality of lengths of linear conductor films, each having a second width, are formed along a second direction intersecting the first direction with a second interval provided therebetween.

Now, advantageous effects of the embodiments of the invention disclosed under the present application are briefly described as follows.

Because a capacitive area of a stacking-type capacitive element can be increased, it is possible to secure the same capacitive area as that for a single-layer capacitive element eve if reduction is made in planar dimensions. Accordingly, the area of the capacitive element for the power supply circuit can be reduced without impairing performance, and without addition of an extra step in a manufacturing process. Thus, the invention is effective in attempting reduction in cost of a semiconductor device having the microcomputer with the nonvolatile memory mounted therein.

BRIEF DESCRIPTION OF THE DRAWINGS

FIG. 2 (b) is a schematic illustration showing one example of a circuit configuration of the stacking-type capacitive element;

FIG. 9 (a) is a table summing up a capacitive area of the stacking-type capacitive element wherein the lower electrode is formed in the grid-like shape according to the one embodiment of the invention;

FIG. 9 (b) is a table summing up a capacitive area of a single-layer capacitive element;

FIG. 9 (c) is a table summing up a capacitive area of the stacking type capacitive element wherein the lower electrode is formed in the flat shape;

FIG. 27 (b) is a sectional view of the principal parts, taken on line E-E' in FIG. 27 (a)

DETAILED DESCRIPTION OF THE PREFERRED EMBODIMENTS

Figure 1:
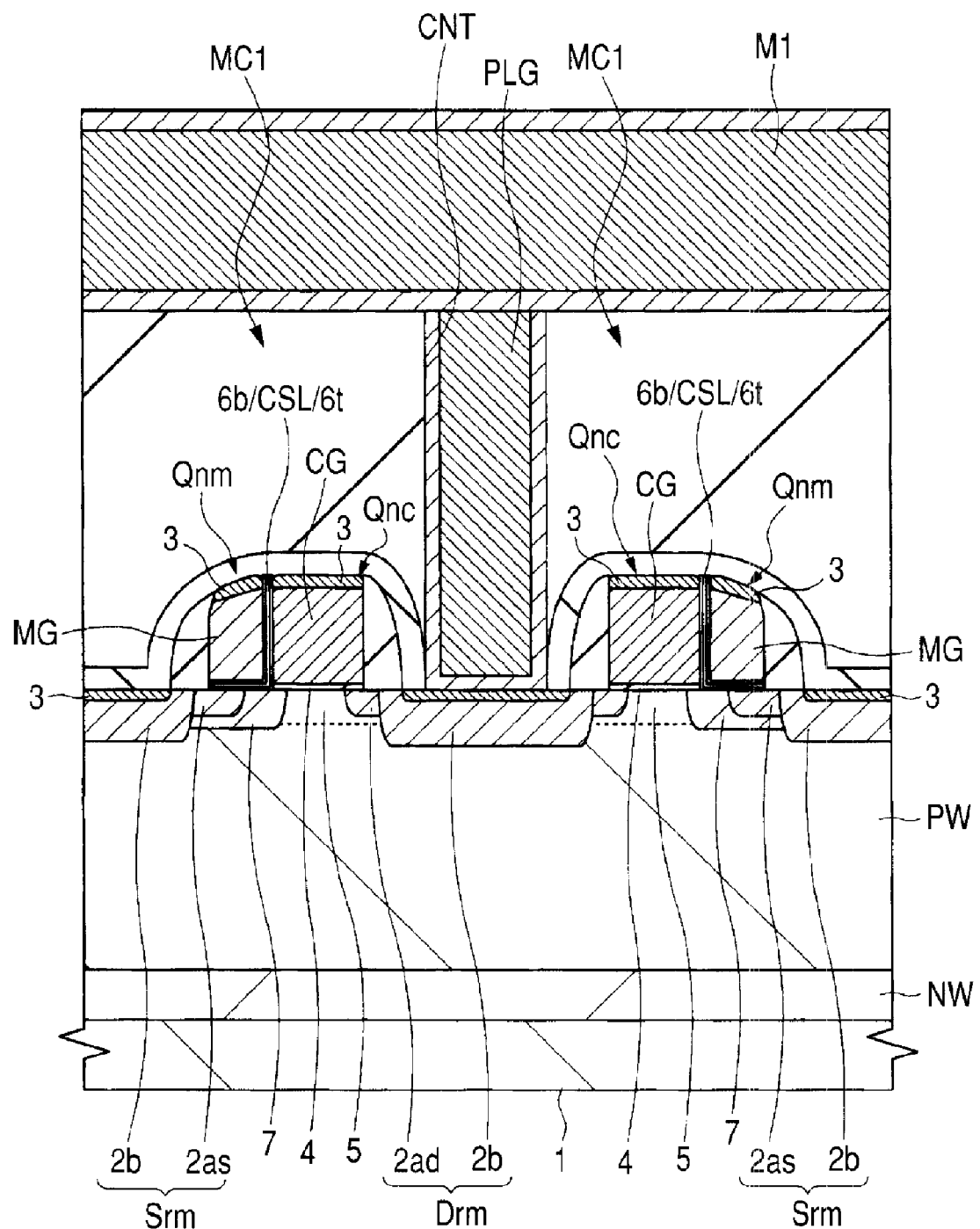
FIG. 1 is a sectional view of principal parts of one example of a split-gate MONOS memory cell for power supply circuit, mounted in a microcomputer with a MONOS nonvolatile memory, mounted therein, according to one embodiment of the invention.

An embodiment of the invention is divided into a plurality of sections, or a plurality of embodiments as necessary for convenience's sake before giving description thereof, however, it is to be understood that those sections and embodiments are not unrelated to each other, unless otherwise stated expressly, and that any of the sections, or the embodiments, on the one hand, represents a variation of part or the whole of the former, detailed and supplementary description thereof, and so forth, on the other hand.

Further, with the present embodiment of the invention, in the case where the number of elements, and so forth (the number of pieces, numerical values, quantity, range, and so forth are included) are referred to, the number of the elements, and so forth are not limited to a specific number unless otherwise expressly stated, or unless apparently limited to the specific number on a theoretical basis, and the number of the elements, and so forth therefore may be not less than, or not more than the specific number. Still further, with the present embodiment of the invention, it goes without saying that constituent elements (constituent steps included) thereof are not necessary essential unless otherwise expressly stated, or unless apparently considered essential on the theoretical basis. Similarly, with the present embodiment of the invention, in the case where shapes, positional relationship, and so forth of the constituent elements are referred to, those, in effect, approximate to, or similar to the shapes, positional relationship, and so forth are to be included unless otherwise expressly stated, or unless apparently considered otherwise on the theoretical basis. The same applies to the numerical values, and the range, described as above.

Further, in the case of a drawing in use with reference to the present embodiment of the invention, there is also a case where even a plan view is hatched to enable the drawing to be seen with greater ease. Further, with the present embodiment of the invention, a MISFET (Metal Insulator Semiconductor Field Effect Transistor) representative of field effect transistors is abbreviated to MIS, a p-channel MISFET is abbreviated to pMIS, and an n-channel MISFET is abbreviated to nMIS. Further, a MOSFET (Metal Oxide Semiconductor FET) is a field effect transistor of a structure wherein a gate insulating film is comprised of a silicon oxide ($SiO_2$, and so forth) film, and the MOSFET is to be included in a subordinate conception of the MIS as above. Further, a MONOS memory cell described with reference to the present embodiment of the invention is obviously included in the subordinate conception of the MIS as above. Still further, with the present embodiment of the invention, what is referred to as silicon nitride is to include not only $Si_3N_4$, as is obvious, but also any insulating film similar in composition to any nitride of silicon. Still further, with the present embodiment of the invention, what is referred to as a wafer is to indicate mainly an Si (silicon) monocrystal wafer, however, the same is to indicate not only that but also a SOT (Silicon On Insulator) wafer, an insulating film substrate for forming an IC thereon, and so forth. The shape of the wafer includes not only a circle, or a semicircle but also a square, a rectangle, and so forth.

Furthermore, in all the drawings used in describing the present embodiment of the invention, constituent elements having identical functions are denoted by like reference numerals, omitting repeated description thereof. Now, there are described in detail hereinafter embodiments of the invention with reference to the accompanying drawings.

A floating gate system using the floating gate previously described is a charge-holding system wherein charge is stored in conductors electrically isolated from each other, however, there is a MONOS (Metal Oxide Nitride Oxide Semiconductor) system wherein charge is stored in insulators such as nitride films having the nature of storing charge therein, as another charge conservation system different from the floating gate system. Because the MONOS system is a discrete memory system for storing charge in respective insulators, the system has an advantage of being tolerant of defects occurring to oxide films surrounding the respective insulators since the charge as held will not be lost in its entirety even if there exist a few leakage paths. Accordingly, the MONOS system is one of the charge conservation system, lately attracting attention as progress toward miniaturization advances, owing mainly to applicability of oxide films with a thickness as small as not more than 8 nm, thereby rendering the system suitable for miniaturization, easiness in forecasting reliability of the system, due to elimination of extreme deterioration in life-time for charge conservation, otherwise caused by defects occurring at a low probability, and simplicity in the structure of the memory cells, making it easier to mount the memory cells jointly with a logic circuitry.

With a split-gate MONOS memory cell comprising a select field effect transistor, and a memory field effect transistor, among the memory cells of a nonvolatile memory of the MONOS system, an SSI (Source Side Injection) system can be adopted, so that it is possible to attempt achieving a higher speed in writing, and reduction in area of a power supply unit. Further, the SSI system can be operated at a relatively low voltage as compared with an FN tunneling injection system, so that, for example, the select field effect transistor of the memory cell, and a field effect transistor coupled to the select field effect transistor can be formed of a low-voltage field effect transistor small in device area. Accordingly, peripheral circuitry can be reduced in area, so that the split-gate MONOS memory cell is suitable for use when it is mounted jointly with a logic semiconductor device.

There is a memory cell serving as the split-gate MONOS memory cell suitable for miniaturization, having a structure wherein either the select field effect transistor, or the memory field effect transistor is formed of a sidewall by taking advantage of self-alignment. In this case, an advantage is gained in that an alignment margin for photolithography is unnecessary, and a gate length of the field effect transistor formed by taking advantage of the self alignment can be rendered not more than a minimum resolution dimension. Accordingly, it is possible to implement a memory cell more miniaturized than a conventional memory cell wherein the select field effect transistor, and the memory field effect transistor are each formed by use of a photo mask.

Now, with the present embodiment of the invention, there is described hereinafter a logic semiconductor device with the nonvolatile memory of the MONOS system, comprised of the split-gate MONOS memory cells, mounted therein (hereinafter referred to merely as a microcomputer with the MONOS nonvolatile memory, mounted therein). A split gate MONOS memory cell, and a stacking-type capacitive element C1 for a power supply circuit, mounted in the microcomputer with the MONOS nonvolatile memory, mounted therein, according to one embodiment of the invention, are described with reference to FIGS. 1 to 8.

First, referring to FIG. 1, there is described an example of the structure of the split gate MONOS memory cell according to one embodiment of the invention. FIG. 1 is a sectional view of principal parts of the split-gate MONOS memory cell.

As shown in FIG. 1, a semiconductor substrate 1 is comprised of, for example, a p-type monocrystal silicon, and an embedded n-well NW, and an embedded p-well PW are formed in the semiconductor substrate 1. A select nMIS (Qnc) and a memory nMIS (Qnm) of a memory cell MC1 according to the present embodiment of the invention are disposed in a principal surface (device-forming surface) of the semiconductor substrate 1. A drain region Drm, and a source region Srm of the memory cell MC1 have, for example, relatively lightly doped n$^-$type semiconductor regions 2ad, 2as, respectively, and a relatively heavily doped n$^+$type semiconductor region 2b higher in impurity concentration than the n$^-$type semiconductor regions 2ad, 2as, respectively, (LDD (Lightly Doped Drain structure)). The n$^-$type semiconductor regions 2ad, 2as are each disposed on a side of the memory cell MC1, adjacent to a channel region thereof while the n$^+$type semiconductor region 2b is disposed at respective positions further away from the channel region of the memory cell MC1 by a distance corresponding to the n$^-$type semiconductor regions 2ad, 2as, respectively.

A select gate electrode CG of the select nMIS (Qnc) and a memory gate electrode MG of the memory nMIS (Qnm) are each extended in such a way as to be adjacent to each other over a portion of the principal surface of the semiconductor substrate 1, between the drain region Drm and the source region Srm, and a plurality of the memory cells MC1 are adjacent to each other in a direction under which the select gate electrode CG and the memory gate electrode MG are extended through the intermediary of a device-separation part formed over the semiconductor substrate 1. The select gate electrodes CG are disposed in a first region of the principal surface of the semiconductor substrate 1, and the memory gate electrodes MG are disposed in a second region differing from the first region of the principal surface of the semiconductor substrate 1. The select gate electrode CG is comprised of, for example, an n-type polycrystalline silicon film, impurity concentration thereof is, for example, in a range of $1 \times 10^{20}$ to $1 \times 10^{21}$ cm$^{-3}$, a gate length thereof is, for example, in a range of 0.2 to 0.3 μm, and a thickness thereof is, for example, 0.25 μm. The memory gate electrode MG is comprised of, for example, an n-type polycrystalline silicon film, impurity concentration thereof is, for example, in a range of $1 \times 10^{20}$ to $1 \times 10^{21}$ cm$^{-3}$, and a gate length thereof is, for example, in a range of 0.05 to 0.15 μm.

A silicide layer 3 comprised of, for example, any of cobalt silicide, nickel silicide, titanium silicide, and so forth is formed over respective upper surfaces of the select gate electrode CG, the memory gate electrode MG, and portions of the n$^+$type semiconductor region 2b, corresponding to parts of the source region Srm, and the drain region Drm, respectively. With the split gate MONOS memory cell, the memory cell MC1 needs to feed a potential to both the select gate electrode CG and the memory gate electrode MG, and an operating speed thereof is largely dependent on respective resistance values of the select gate electrode CG, and the memory gate electrode MG. It is therefore desirable to attain lowering of respective resistances of the select gate electrode CG, and the memory gate electrode MG by forming the silicide layer 3. The silicide layer 3 has a thickness of, for example, 20 nm.

A gate insulting film 4 comprised of a silicon oxide film small in thickness, in a range of, for example, 1 to 5 nm, is provided between the select gate electrode CG and the principal surface of the semiconductor substrate 1. Accordingly, the select gate electrodes CG are disposed over the inter-device separation part, and over the first region of the semiconductor substrate 1, through the intermediary of the gate insulting film 4. For example, boron is introduced into a portion of the principal surface of the semiconductor substrate 1, underneath the gate insulting film 4, thereby forming a p-type semiconductor region 5. The semiconductor region 5 is a semiconductor region for forming the channel of the select nMIS (Qnc), and a threshold voltage of the select nMIS (Qnc) is set to a predetermined value by the semiconductor region 5.

The memory gate electrode MG is provided on one side of a sidewall of the select gate electrode CG, and insulation between the select gate electrode CG, and the memory gate electrode MG is effected by a charge conservation insulating film formed by sequentially depositing an insulating film 6b, a charge storage layer CSL, and an insulating films 6t (hereinafter the charge conservation insulating film is referred to as the insulating films 6b, 6t, and the charge storage layer CSL). Further, the memory gate electrodes MG are disposed over the second region of the semiconductor substrate 1, through the intermediary of the insulating films 6b, 6t, and charge storage layer CSL. In FIG. 1, notation of the insulating films 6b, 6t, and the charge storage layer CSL is expressed as 6b/CSL/6t.

The charge storage layer CSL is provided in such a state as sandwiched between the insulating film 6b above and the insulating film 6t below, and is comprised of, for example, a silicon nitride film, having a thickness in a range of, for example, 5 to 20 nm. The silicon nitride film is an insulating film having discrete trap levels within the film, the trap levels each having a function for storing charge. The insulating films 6b, 6t each are comprised of, for example, a silicon oxide film, and so forth, and the insulating film 6b has a thickness in a range of, for example, 1 to 10 nm while the insulating film 6t has a thickness in a range of, for example, 5 to 15 nm. The insulating films 6b, 6t each can be formed of a silicon oxide film containing nitrogen.

A semiconductor region 7 is a semiconductor region for forming the channel of the memory nMIS (Qnm), and a threshold voltage of the memory nMIS (Qnm) is set to a predetermined value by the semiconductor region 7. A first layer interconnection M1 extended in a second direction intersecting the memory gate electrodes MG (or the select gate electrodes CG) extended in a first direction is coupled to the drain region Drm via a plug PLG embedded in a contact hole CNT. The interconnection M1 is a bit line of each of the memory cells MC1.

Figure 2A:
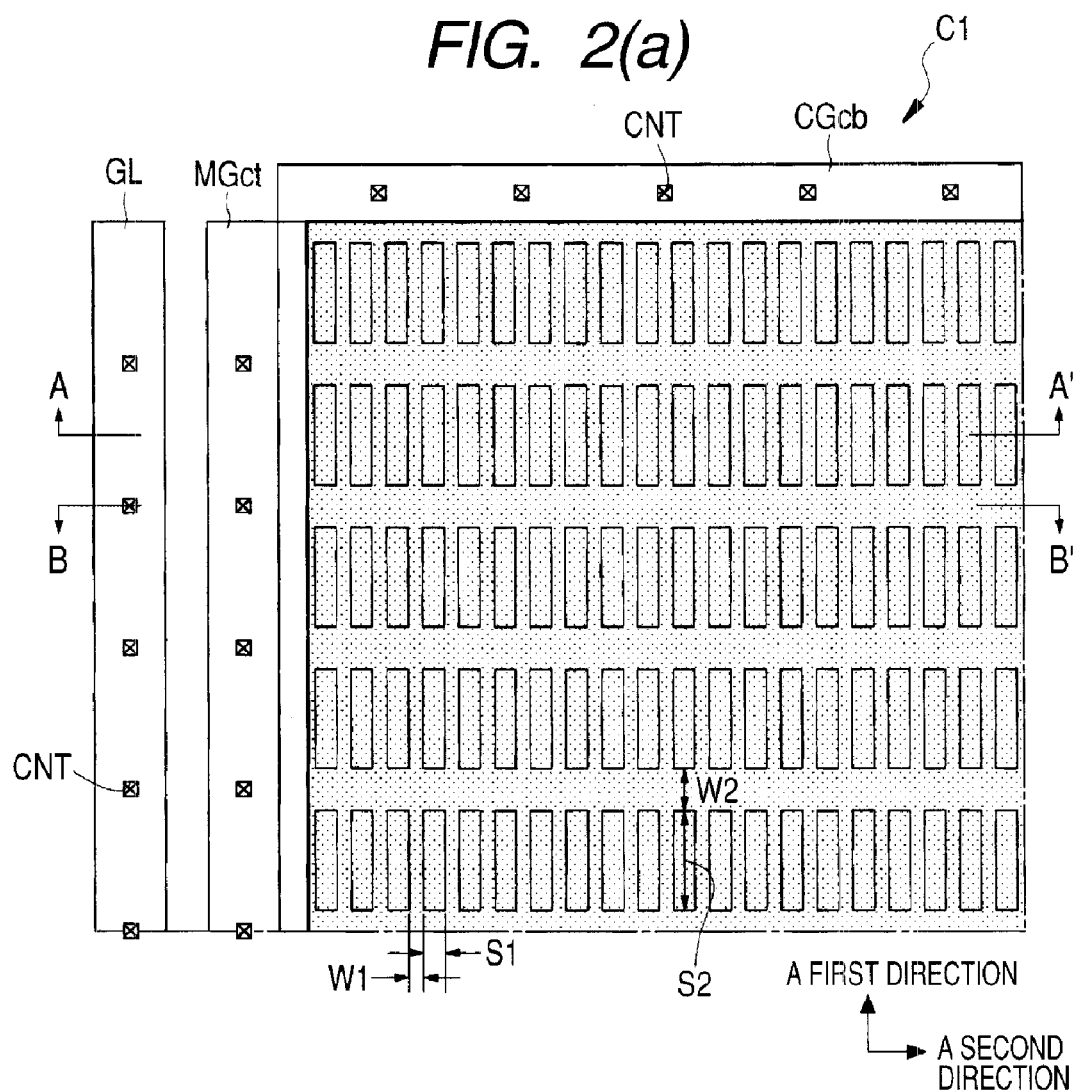
FIG. 2 (a) is a plan view of principal parts of a first example of a stacking-type capacitive element for a power supply circuit, according to the one embodiment of the invention.
Figure 2B:
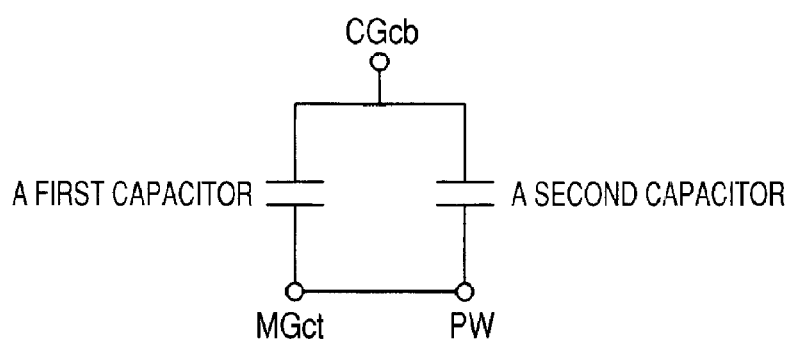
Figure 3:
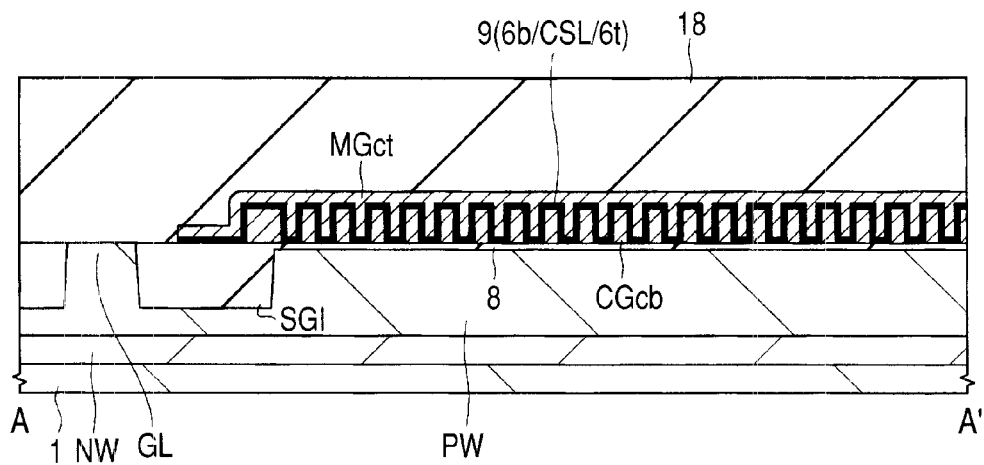
FIG. 3 is a sectional view of the principal parts, taken on line A-A' of FIG. 2 (a)
Figure 4:
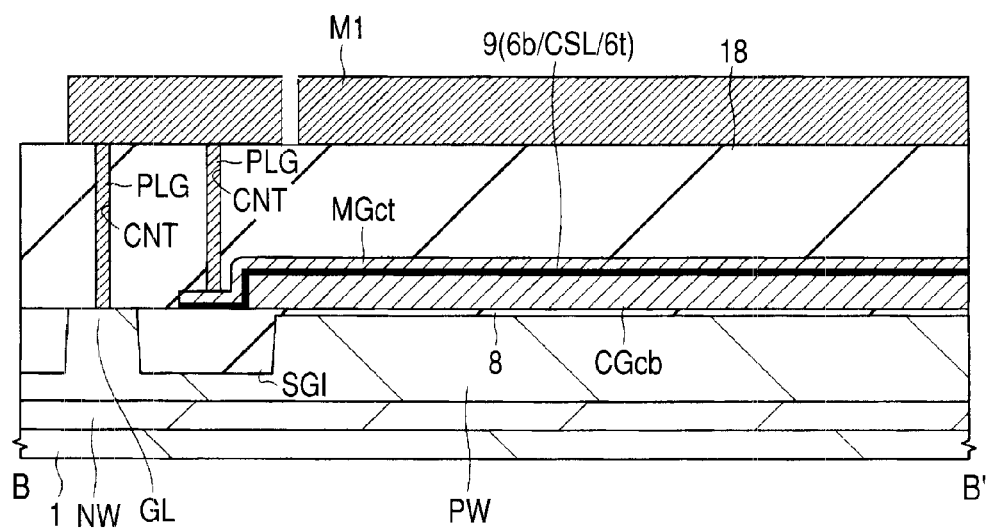
FIG. 4 is a sectional view of the principal parts, taken on line B-B' of FIG. 2 (a)
Figure 5:
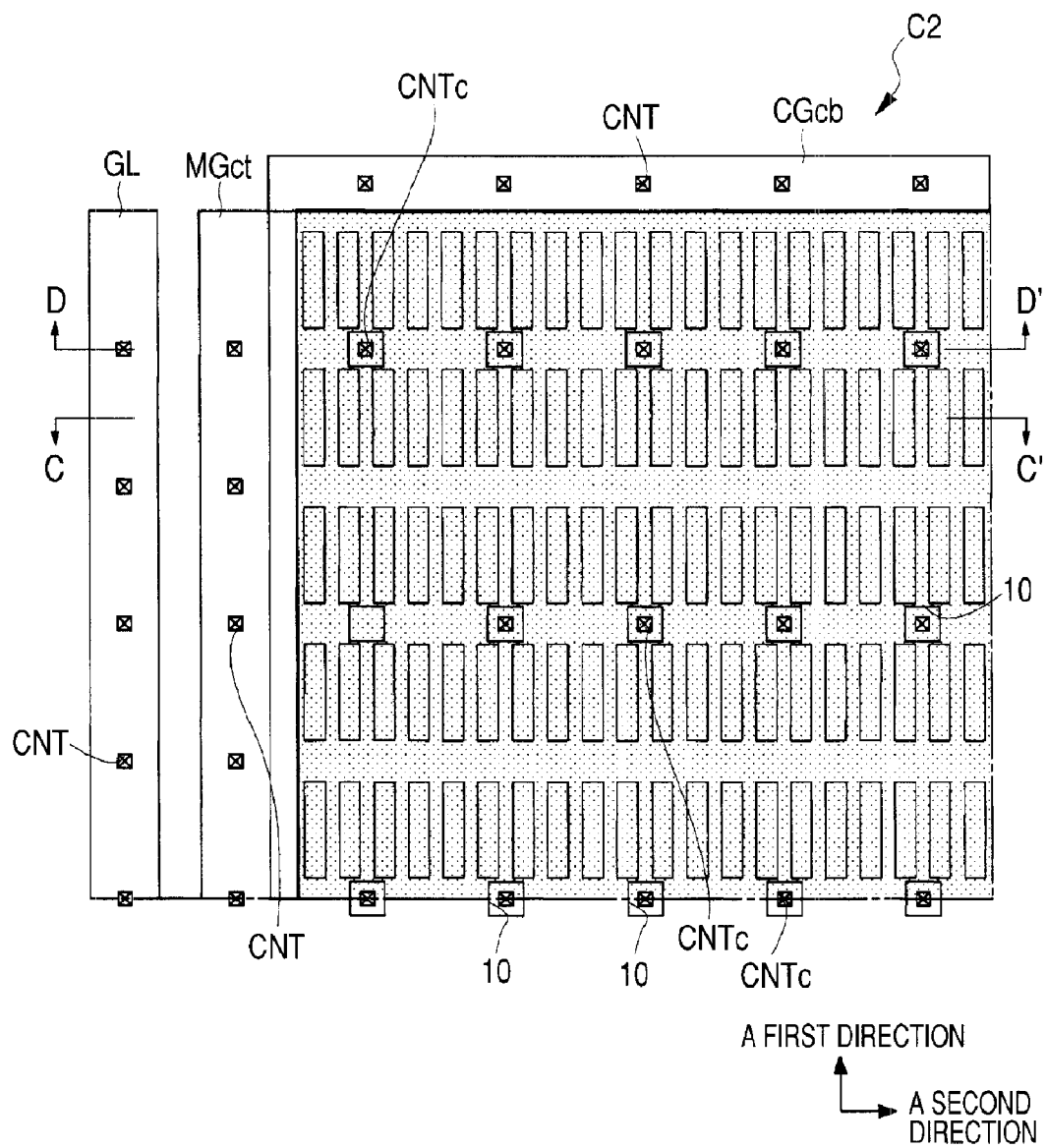
FIG. 5 is a plan view of principal parts of a second example of the stacking-type capacitive element for the power supply circuit, mounted in the microcomputer with the MONOS nonvolatile memory, mounted therein, according to the one embodiment of the invention.
Figure 6:
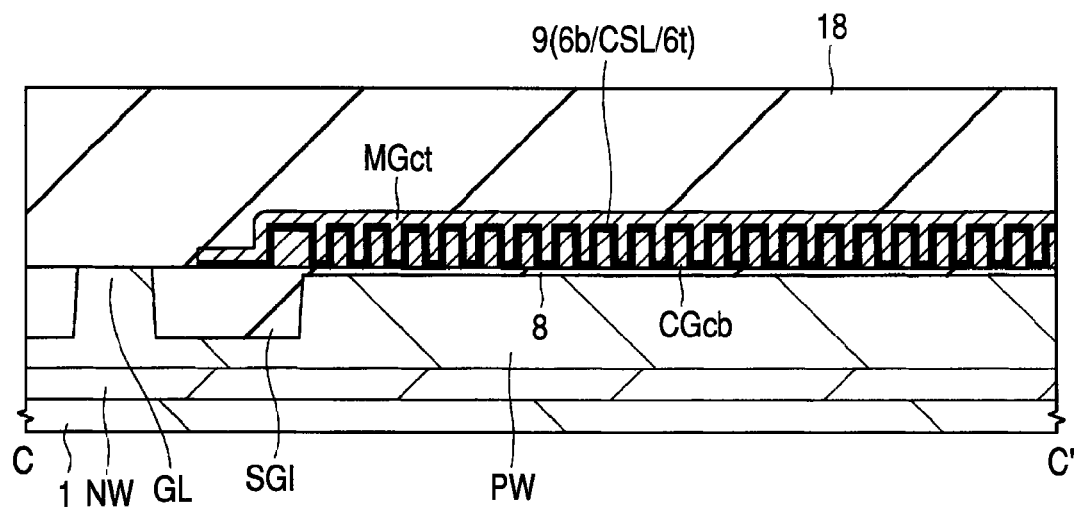
FIG. 6 is a sectional view of the principal parts, taken on line C-C' of FIG. 5.
Figure 7:
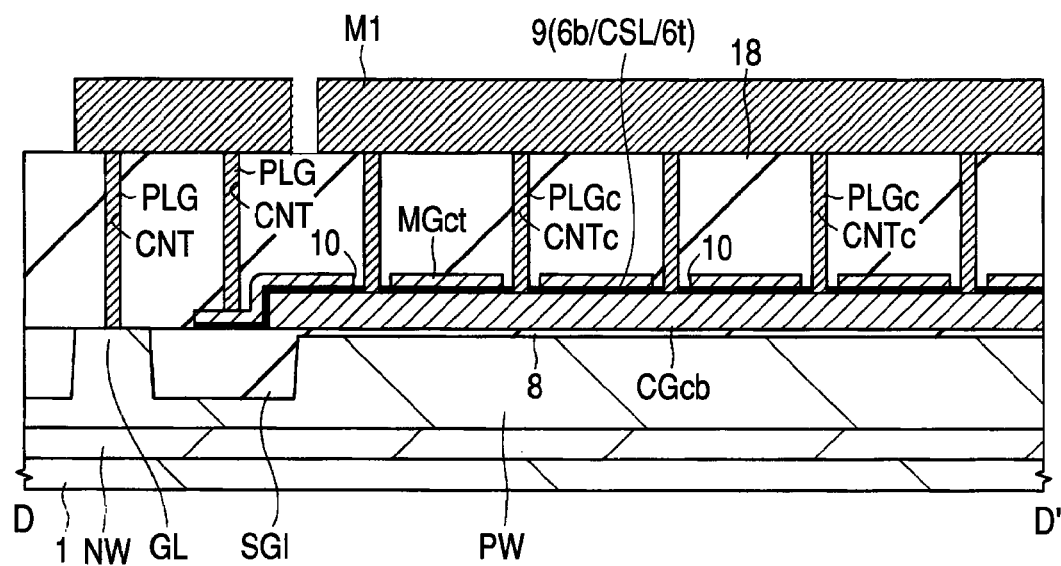
FIG. 7 is a sectional view of the principal parts, taken on line D-D' of FIG. 5.
Figure 8:
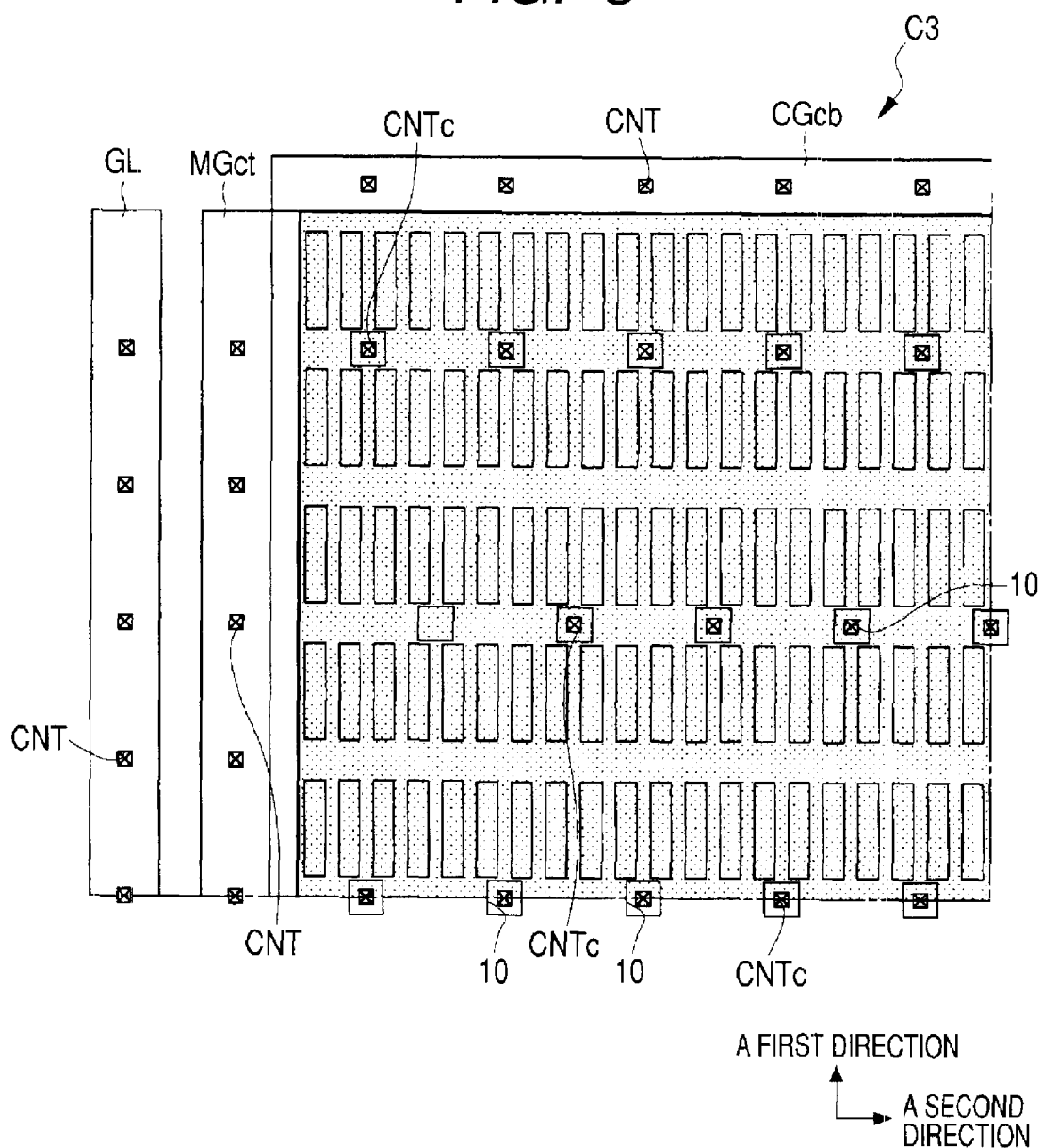
FIG. 8 is a plan view of principal parts of a third example of the stacking-type capacitive element for the power supply circuit, mounted in the microcomputer with the MONOS nonvolatile memory, mounted therein, according to the one embodiment of the invention.

Next, the structure of a stacking-type capacitive element for the power supply circuit, according to one embodiment of the invention, is described hereinafter with reference to FIGS. 2 to 8. FIGS. 2 to 4 each are a drawing for describing a first example of the stacking-type capacitive element for the power supply circuit, FIG. 2 (a) is a plan view of principal parts of a first example of the stacking-type capacitive element for the power supply circuit (corresponding to a quarter of the stacking-type capacitive element in whole), FIG. 2 (b) is a schematic illustration showing one example of a circuit configuration of the stacking-type capacitive element, FIG. 3 is a sectional view of the principal parts, taken on line A-A' of FIG. 2 (a), and FIG. 4 is a sectional view of the principal parts, taken on line B-B' of FIG. 2 (a). FIGS. 5 to 7 each are a drawing for describing a second example of the stacking-type capacitive element for the power supply circuit, FIG. 5 is a plan view of principal parts of the second example of the stacking-type capacitive element for the power supply circuit (corresponding to a quarter of the stacking-type capacitive element in whole), FIG. 6 is a sectional view of the principal parts, taken on line C-C' of FIG. 5, and FIG. 7 is a sectional view of the principal parts, taken on line D-D' of FIG. 5. FIG. 8 is a drawing for describing a third example of the stacking-type capacitive element for the power supply circuit, being a plan view of principal parts of the third example of the stacking-type capacitive element for the power supply circuit (corresponding to a quarter of the stacking-type capacitive element in whole). Further, in FIG. 2 (a), FIG. 5, and FIG. 8, respectively, description of interconnections is omitted.

First, there is described hereinafter the first example of the stacking-type capacitive element C1 for the power supply circuit. As shown in FIGS. 2 to 4, the stacking type capacitive element C1 is formed in an active region (a region indicted by net-like hatching in FIG. 2 (a)) of the principal surface of the semiconductor substrate 1. The active region has outside dimensions (planar dimensions) of, for example, 10 μm×10 μm (in FIG. 2 (a), 5 μm×5 μm, corresponding to a quarter of the outside dimensions, is shown). An insulating film in the same layer as a gate insulating film of a high-voltage CMIS of a peripheral circuit is formed over the principal surface of the semiconductor substrate 1 of the stacking type capacitive element C1, and the insulating film serves as a first capacitive insulating film 8. Further, a lower electrode CGcb comprised of a conductor film in the same layer as the select gate electrode CG of the select nMIS (Qnc) of the memory cell MC1, and an upper electrode MGct comprised of a conductor film in the same layer as the memory gate electrode MG of the memory nMIS (Qnm) are formed over the first capacitive insulating film 8, and an insulating film in the same layer as the insulating films 6b, 6t, and the charge storage layer CSL, formed between the lower electrode CGcb and the upper electrode MGct, serves as a second capacitive insulating film 9.

That is, a first capacitor is formed between the active region of the semiconductor substrate 1, provided through the intermediary of the first capacitive insulating film 8 (the insulating film in the same layer as the gate insulating film of the high-voltage MIS of the peripheral circuit) and the lower electrode CGcb. With the present embodiment of the invention, the embedded n-well NW, and the embedded p-well PW are formed in the semiconductor substrate 1, and the first capacitor is formed between the p-well PW and the lower electrode CGcb. Further, a second capacitor is formed between the lower electrode CGcb and the upper electrode MGct, provided through the intermediary of the second capacitive insulating film 9 (the insulating film in the same layer as the insulating films 6b, 6t, and the charge storage layer CSL). Thus, the two capacitors are parallel-coupled to each other, thereby forming the stacking-type capacitive element C1.

Further, with the present embodiment of the invention, the p-well PW is shown as one of the electrodes of the capacitive element by way of example, however, the n-well NW can be used in place of the p-well PW.

As shown in FIG. 2 (b), the two capacitors (the first capacitor and the second capacitor) can be parallel-coupled to each other by coupling the upper electrode MGct to the active region (the p-well PW) of the semiconductor substrate 1. For example, a power supply unit GL of the active region (the p-well PW) surrounded by the inter-device separation parts SGI is formed in the principal surface of the semiconductor substrate 1, and a plug PLG embedded in a contact hole CNT formed in an interlayer dielectric 18 covering the stacking-type capacitive element C1, reaching the power supply unit GL of the active region (the p-well PW), and a plug PLG embedded in a contact hole CNT formed in the interlayer dielectric 18 covering the stacking-type capacitive element C1, reaching an outlet of the upper electrode MGct, are coupled to the first layer interconnection M1, thereby enabling the two capacitors (the first capacitor and the second capacitor) to be parallel-coupled to each other. Further, the lower electrode CGcb, and the upper electrode MGct each are provided with an outlet making no contribution in capacitance to the stacking-type capacitive element C1, and via a plug PLG embedded in a contact hole CNT reaching this outlet, the first layer interconnection M1 is coupled to the lower electrode CGcb, or the upper electrode MGct, respectively.

The first capacitive insulating film 8 (the gate insulating film of the high-voltage MIS of the peripheral circuit) has a thickness of, for example, 15 nm, and the second capacitive insulating film 9 (the insulating films 6b, 6t, and the charge storage layer CSL) has a thickness of, for example, in a range of 10 to 45 nm. Outside dimensions of the lower electrode CGcb are, for example, 10.8 μm×10.4 μm, (FIG. 2 (a) shows 5.4 μm×5.2 μm, corresponding to a quarter of the outside dimensions), and outside dimensions of a portion of the lower electrode CGcb configuring the capacitor, contributing to capacitance thereof, are, for example, 10 μm×10 μm. Further, outside dimensions of the upper electrode MGct are, for example, 10 μm×11.4 μm, (FIG. 2 (a) shows 5 μm×5.7 μm, corresponding to a quarter of the outside dimensions), and outside dimensions of a portion of the upper electrode MGct configuring the capacitor, contributing to capacitance thereof, are, for example, 10 μm×10.4 μm.

Further, a planar shape of the lower electrode CGcb is a grid-like shape (a shape of parallel crosses) having a plurality of lengths of linear conductor films each having a first width, formed along the first direction with a first interval provided therebetween, and a plurality of lengths of linear conductor films each having a second width, formed along the second direction (the direction intersecting the first direction) with a second interval provided therebetween. The first interval S1 between the linear conductor films formed along the first direction is, for example, 0.15 μm, and the first width W1 is, for example, 0.1 μm while the second interval S2 between the linear conductor films formed along the second direction is, for example, 0.7 μm, and the second width W2 is, for example, 0.3 μm.

More specifically, a plurality of grooves are formed in the lower electrode CGcb. Respective grooves have a width S1 in the first direction, and the respective grooves are disposed at intervals W1 in the first direction. Further, the respective grooves have a width S2 in the second direction, and the respective grooves are disposed at intervals W2 in the second direction. Thus, with the present embodiment of the invention, there is shown an example where a plurality of pieces of grooves in the shape of a quadrangle with a width S1, and S2, in the first direction, and in the second direction, respectively.

Now, with the lower electrodes CGcb, each linear in shape, making the grid-like shape, the first width W1 of the linear conductor film of the lower electrode CGcb, formed along the first direction, and the first interval S1 between the linear conductor films, or the second width W2 of the linear conductor film of the lower electrode CGcb, formed along the second direction, and the second interval S2 between the linear conductor films are rendered smaller in value than a thickness of the lower electrode CGcb, thereby enabling capacitance corresponding to sidewalls of the lower electrode CGcb to increase. That is, a depth (the thickness of the lower electrode CGcb) of each of the grooves of the lower electrode CGcb is greater than the interval W1 between the respective grooves. Further, the depth of each of the grooves of the lower electrode CGcb is greater than the width S1 of each of the grooves of the lower electrode CGcb. Furthermore, it is also possible to render the depth of each of the grooves of the lower electrode CGcb greater than the interval W2 between the respective grooves, and the width S2 of each of the grooves.

However, in consideration a possibility of defects occurring to a finished shape of the lower electrode CGcb, or poor embedding of the second capacitive insulating film 9, and the upper electrode MGct, formed in the first interval S1, or the second interval S2, and so forth, it is preferable to decide the first width W1, and the first interval W1 for the linear conductor film formed along the first direction, and the second width W2 and the second interval S2 for the linear conductor film formed along the second direction by taking into such a possibility into consideration.

For example, the second width W2, and the second interval S2 for the linear conductor film formed along the second direction of the lower electrode CGcb are set to a dimension identical to, or greater than the thickness H of the lower electrode CGcb, the first width W1 for the linear conductor film formed along the first direction is set to a dimension smaller than the thickness H of the lower electrode CGcb, and the first interval S1 is set to a dimension smaller than the thickness H of the lower electrode CGcb (H>W1, H>S1). Accordingly with the present embodiment, a typical thickness of the lower electrode CGcb is 0.25 μm, the first width W1 of the linear conductor film formed along the first direction is, for example, 0.1 μm, and the first interval S1 is, for example, 0.15 μm.

Further, in order to decrease delay due to resistance of the lower electrode CGcb, the first layer interconnection M1 may be directly coupled to an upper surface of the lower electrode CGcb forming the capacitor.

Next, there is described hereinafter a second example of a stacking-type capacitive element C2 for a power supply circuit, wherein a first layer interconnection M1 is directly coupled to an upper surface of a lower electrode CGcb forming a capacitor. As shown in FIGS. 5 to 7, with the stacking type capacitive element C2, a plurality of openings 10 are provided in an upper electrode MGct. An interlayer dielectric 18 is formed over the upper electrode MGct including respective interiors of the plural openings 10, a contact hole CNTc is provided in respective portions of the interlayer dielectric 18, inside the plural openings 10, and the first layer interconnection M1 is directly coupled to the upper surface of the lower electrode CGcb forming the capacitor via a plug PLGc embedded in the respective contact holes CNTc. That is, the plural openings 10 are provided in respective regions of the lower electrode CGcb, positioned between respective grooves formed in the lower electrode CGcb.

By directly coupling the first layer interconnection M1 to the upper surface of the lower electrode CGcb forming the capacitor, as described in the foregoing, it is possible to decrease delay due to the resistance of the lower electrode CGcb. The opening 10 has dimensions of, for example, 0.25 µm×0.25 µm, and the contact hole CNTc provided inside the opening 10 has dimensions of, for example, 0.1 µm×0.1 µm.

In order to prevent occurrence of delay, due to the resistance of the lower electrode CGcb, the number of the openings 10 provided in the upper electrode MGct may be preferably increased, however, this will result in reduction of a capacitive area. With the stacking type capacitive element C2, the plurality of (for example, 9 to 10 pieces of) the openings 10 are disposed in a line at equal intervals (for example, at intervals of 1 µm) along the second direction for every other linear conductor film formed along the second direction of the lower electrode CGcb. The plural openings 10 are disposed in a line at equal intervals (for example, at intervals of 2 µm) along the first direction as well.

Further, in a plan view of the stacking-type capacitive element C2 shown in FIG. 5, the openings 10 disposed in one line at equal intervals along the first direction, and the second direction, respectively, are shown by way of example. However, it is to be pointed out that the invention is not limited thereto.

Next, there is described hereinafter a third example of a stacking-type capacitive element C3 for a power supply circuit, wherein a first layer interconnection M1 is directly coupled to an upper surface of a lower electrode CGcb configuring a capacitor. As shown in FIG. 8, with the stacking-type capacitive element C3, as is the case with the stacking-type capacitive element C2 described as above, a plurality of openings 10 are provided in an upper electrode MGct, and the plural (for example, 9 to 10 pieces of) openings 10 are disposed at equal intervals (for example, at intervals of 1 µm) along the first direction for every other linear conductor film formed along the second direction of the lower electrode CGcb. However, the openings 10 are not disposed in a line along the first direction, but are disposed in such a fashion as to be staggered along the first direction. Further, it is obvious that placement of the openings 10 is not limited to such a placement as described with reference to the stacking-type capacitive elements C2, C3, described as above, and that various changes may be made thereto.

Figure 27A:
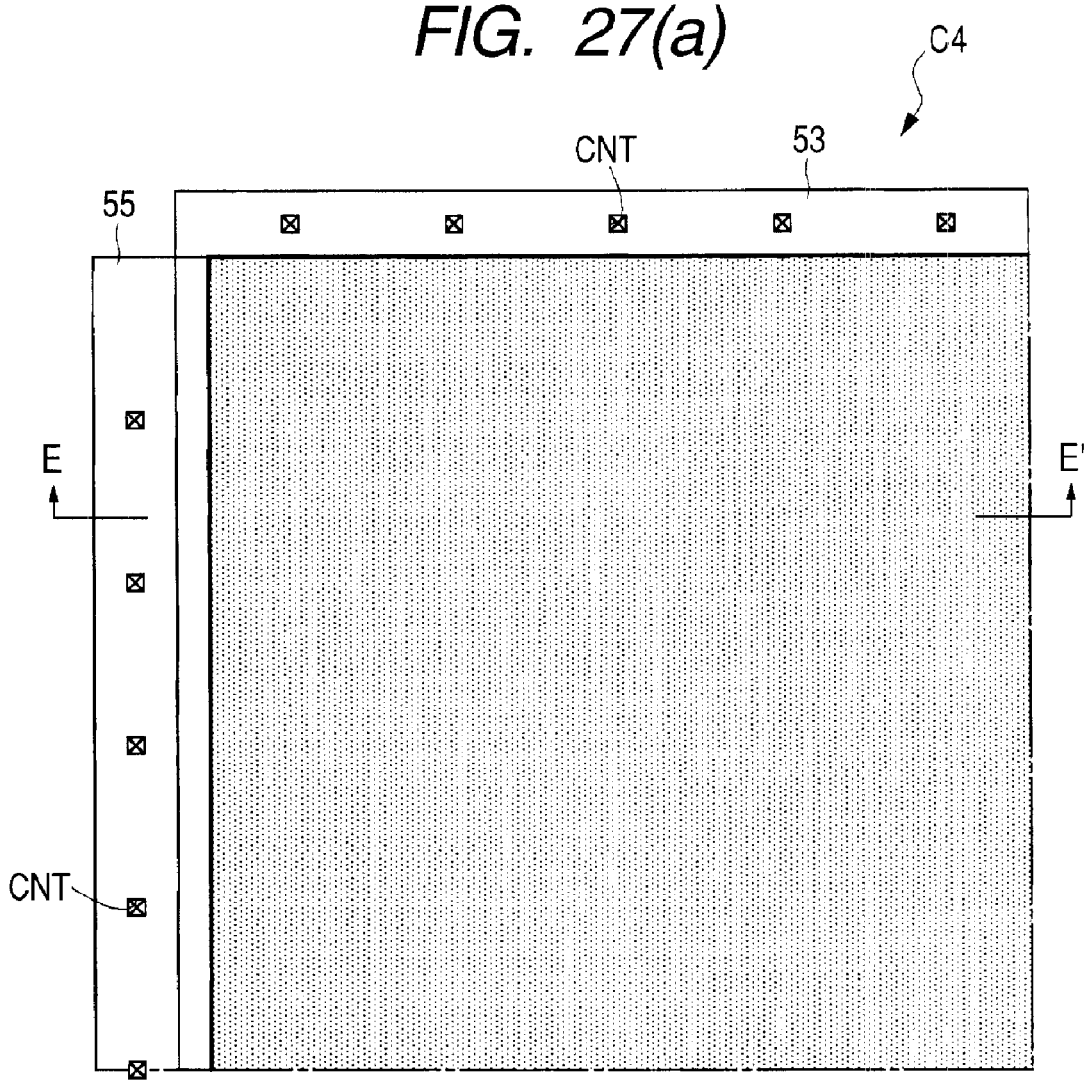
FIG. 27 (a) is a plan view of principal parts of a stacking type capacitive element reviewed by the inventor, et al.
Figure 27B:
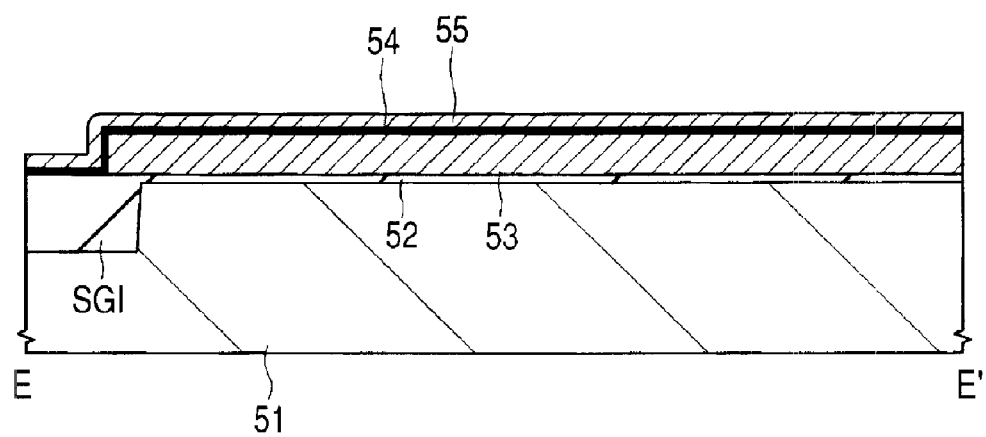

Now, capacitance of a stacking-type capacitive element for a power supply circuit is examined hereinafter. In FIG. 9 (a), there is summed up a capacitive area of the stacking-type capacitive element according to the one embodiment of the invention (for example, the stacking type capacitive element C1 described with reference to FIGS. 2 to 4), wherein the lower electrode is formed in the grid-like shape. Further, in FIGS. 9 (b), and 9 (c), respectively, there are summed up a capacitive area of a single-layer capacitive element as a comparative example, and a capacitive area of the stacking type capacitive element wherein the lower electrode is formed in the flat shape other than the grid-like shape as another comparative example, (for example, the stacking-type capacitive element C4 described with reference to FIGS. 27 (a), and 27 (b)). Herein, assuming that the first and second capacitive insulating films each have an electrical film thickness (film thickness as converted in terms of $SiO_2$ in consideration of dielectric constant) of 15 nm, the lower electrode has a thickness of 0.25 µm, the upper electrode has a thickness of 0.08 µm, and the active region has outside dimensions (planar dimensions) of 10 µm×10 µm, a capacitive area was worked out with respect to the single-layer capacitive element, the stacking type capacitive element wherein the lower electrode is formed in the flat shape, and the stacking-type capacitive element wherein the lower electrode is formed in the grid-like shape.

With the single-layer capacitive element, since the planar shape of a capacitor is a 10 µm square, an area where the active region of the semiconductor substrate of the capacitor is opposed to an electrode with the first capacitive insulating film sandwiched therebetween is 100 $\mu m^2$.

With the stacking type capacitive element C4 wherein the lower electrode is formed in the flat shape, since the planar shape of the first capacitor is a 10 µm square, an area where the active region of the semiconductor substrate of the first capacitor is opposed to the lower electrode with the first capacitive insulating film sandwiched therebetween is 100 $\mu m^2$. Further, an area where the lower electrode is opposed to the upper electrode, in the second capacitor, with the second capacitive insulating film sandwiched therebetween, is 109 $\mu m^2$ if no opening is formed in the upper electrode, and capacitance of a side face of the lower electrode is taken into account. Accordingly, in the case of the stacking type capacitive element C4 wherein no opening is formed in the upper electrode, and the lower electrode is formed in the flat shape, a total capacitive area of the first and second capacitors is 209 $\mu m^2$, so that the stacking type capacitive element C4 can have capacitance about 2.1 times as large as that for the single-layer capacitive element.

With the stacking type capacitive element C1 wherein the lower electrode is formed in the grid-like shape, since the lower electrode configuring the first capacitor is in the grid-like shape, an area where the active region of the semiconductor substrate of the first capacitor is opposed to the lower electrode with the first capacitive insulating film sandwiched therebetween is 58 $\mu m^2$ (in FIG. 2 (a) previously referred to, the first width W1 is 0.1 µm, the first interval S1 is 0.15 µm, the second width W2 is 0.3 µm, and the second interval S2 is 0.7 µm. However, an area where the lower electrode is opposed to the upper electrode, in the second capacitor, with the second capacitive insulating film sandwiched therebetween, is 228 $\mu m^2$ if no opening is formed in the upper electrode, and capacitance of the side face of the lower electrode is taken into account. Accordingly, in the case of the stacking type capacitive element C1 wherein no opening is formed in the upper electrode, and the lower electrode is formed in the grid-like shape, a total capacitive area of the first and second capacitors is 286 $\mu m^2$, so that the stacking type capacitive element C1 can have capacitance about 2.9 times as large as that for the single-layer capacitive element. Further, even if 50 pieces of openings, each having dimensions of, for example, 0.25 µm square, are formed in the upper electrode of the stacking type capacitive element C1, a decrease in capacitive area, due to formation of those openings, amounts only to on the order of 3 µm².

Thus, with the microcomputer with the MONOS nonvolatile memory, comprised of the split-gate MONOS memory cells, mounted therein, according to the present embodiment of the invention, the insulating film in the same layer as the gate insulating film of the high-voltage MIS of the peripheral circuit is used to serve as the first capacitive insulating film 8, the first capacitor is formed between the active region of the semiconductor substrate 1 and the lower electrode CGcb (the conductor film in the same layer as the select gate electrode CG of the select nMIS (Qnc) of the memory cell MC1) with the first capacitive insulating film 8 sandwiched therebetween, the insulating film in the same layer as the insulating films 6b, 6t, and the charge storage layer CSL is used to serve as the second capacitive insulating film 9, and the second capacitor is formed between the lower electrode CGcb in the grid-like shape and the upper electrode MGct (the conductor film in the same layer as the memory gate electrode MG of the memory nMIS (Qnm) of the memory cell M1) with the second capacitive insulating film 9 sandwiched therebetween, forming the stacking-type capacitive element C1 wherein the first and second capacitors are parallel-coupled to each other, thereby enabling a capacitive area not less than twice as large as that for the single-layer capacitive element to be acquired with the planar dimensions remaining the same, but without addition of a particular processing step, so that it is possible to secure the same capacitive area as that for the single-layer capacitive element eve if reduction is made in the planar dimensions. Accordingly, the area of the capacitive element for the power supply circuit can be reduced to thereby enable reduction in cost of the microcomputer with the nonvolatile memory mounted therein to be attained.

Subsequently, there is described hereinafter one example of a method of manufacturing the microcomputer with the MONOS nonvolatile memory, mounted therein, according to the one embodiment of the invention, with reference to FIGS. 10 to 26. FIGS. 10 to 26 each are a sectional view showing principal parts of a memory cell during a process of manufacturing the microcomputer with the MONOS nonvolatile memory, mounted therein, the stacking-type capacitive element C2 for the power supply circuit (part of the sectional view of the principal parts, shown in FIG. 6, and part of the sectional view of the principal parts, shown in FIG. 7), and a high-voltage CMIS (Complementary MIS) of the peripheral circuit, respectively.

Figure 10:
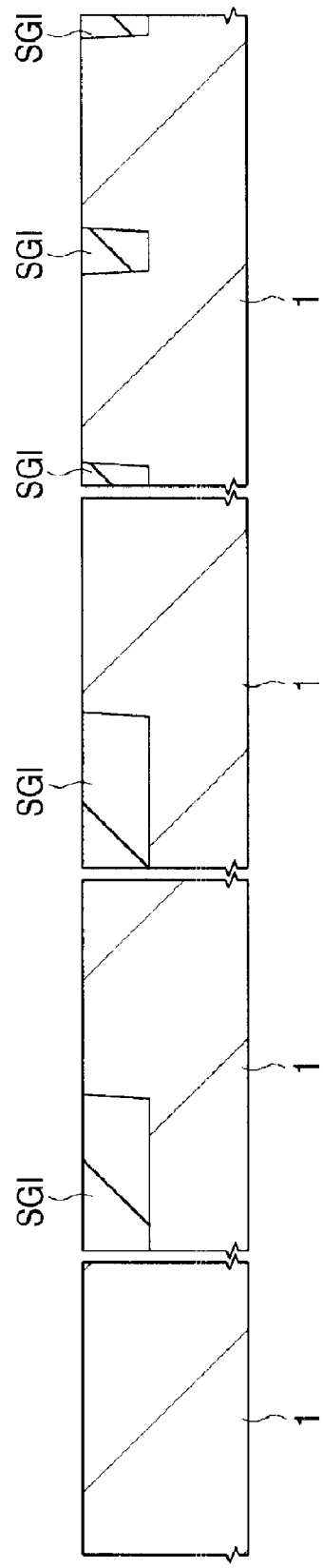
FIG. 10 is a sectional view of principal parts of a semiconductor substrate, illustrating a process of manufacturing the microcomputer with the MONOS nonvolatile memory, mounted therein, according to the one embodiment of the invention.

First, there is prepared a semiconductor substrate 1 comprised of p-type monosilicon having resistivity in a range of, for example, 1 to 10 Ω·cm (in this stage, a semiconductor thin sheet substantially circular in planar shape, called a semiconductor wafer), as shown in FIG. 10. Subsequently, for example, groove-type inter-device separation parts SGI, and the active region disposed in such a way as to be surrounded by the inter-device separation parts SGI, and so forth are formed on the principal surface of the semiconductor substrate 1. More specifically, after forming separation grooves at predetermined spots of the semiconductor substrate 1, an insulating film comprised of, for example, a silicon oxide film is deposited over the principal surface of the semiconductor substrate 1, and further, polishing by CMP (Chemical Mechanical Polishing) method is applied to the insulating film such that the insulating film is left out only within the separation grooves, thereby forming the inter-device separation parts SGI.

Figure 11:
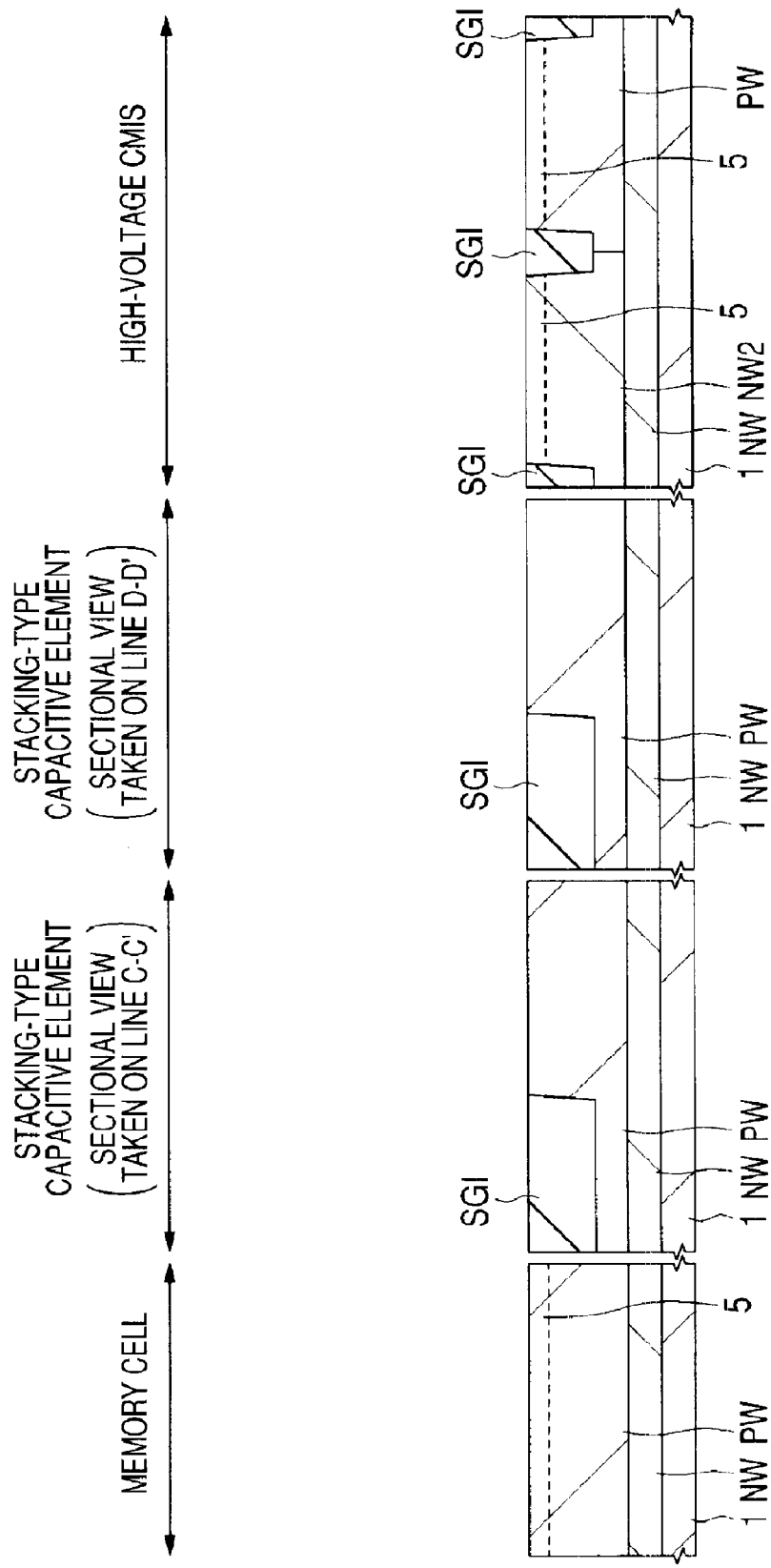
FIG. 11 is a sectional view of the principal parts of the same spots as shown in FIG. 10, in the semiconductor substrate, during a step following the step of manufacturing the microcomputer with the MONOS nonvolatile memory, mounted therein, as shown in FIG. 10.

Next, as shown in FIG. 11, embedded n-well NW, n-well NW2, and p-well PW are formed by selectively introducing predetermined impurities into predetermined parts of the semiconductor substrate 1 at a predetermined energy by use of an ion implantation method, and so forth. Subsequently, impurities are ion-implanted to the principal surface of the semiconductor substrate 1, thereby forming semiconductor regions for formation of channels for various types of MIS. For example, by applying ion implantation of p-type impurities, for example, boron to the principal surface of the semiconductor substrate 1, there is formed the p-type semiconductor region 5 for forming the channel of the select nMIS (Qnc) (refer to FIG. 1) of a memory cell forming region, and the channel of the high-voltage CMIS (Complementary MIS) of a peripheral circuit forming region. Acceleration energy for implantation of the p-type impurities at this point in time is, for example, in a range of 5 to 30 KeV, and an impurity dose is, for example, in a range of 0.5 to $2 \times 10^{13}$ cm$^{-2}$.

Figure 12:
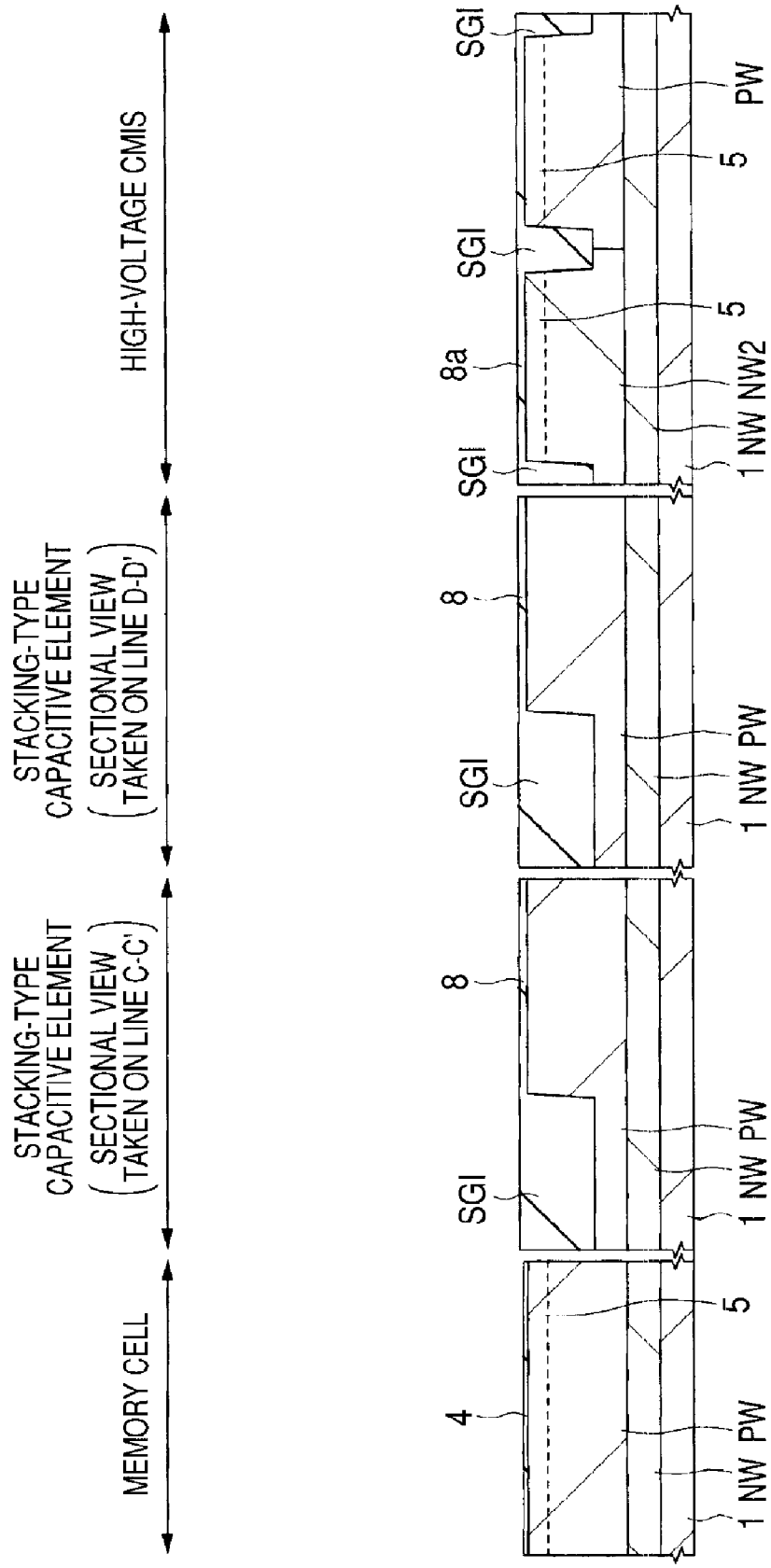
FIG. 12 is a sectional view of the principal parts of the same spots as shown in FIG. 10, in the semiconductor substrate, during a step following the step of manufacturing the microcomputer with the MONOS nonvolatile memory, mounted therein, as shown in FIG. 11.

Next, as shown in FIG. 12, by applying oxidation treatment to the semiconductor substrate 1, an insulating film 12 nm in thickness, comprised of, for example, a silicon oxide film, is formed over the principal surface of the semiconductor substrate 1, and then, a portion of the insulating film, in the memory cell forming region, is removed. Subsequently, by applying oxidation treatment to the semiconductor substrate 1, the gate insulting film 4 comprised of, for example, a silicon oxide film, having a thickness in a range of 1 to 5 nm, is formed over the principal surface of the semiconductor substrate 1, the first capacitive insulating film 8 having a thickness of 15 nm, comprised of, for example, a silicon oxide film, is formed over the principal surface of the semiconductor substrate 1 in a stacking-type capacitive element forming region, and a gate insulting film 8a having a thickness of 15 nm, comprised of, for example, a silicon oxide film, is formed over the principal surface of the semiconductor substrate 1 in a region for forming the high-voltage CMIS of the peripheral circuit.

Figure 13:
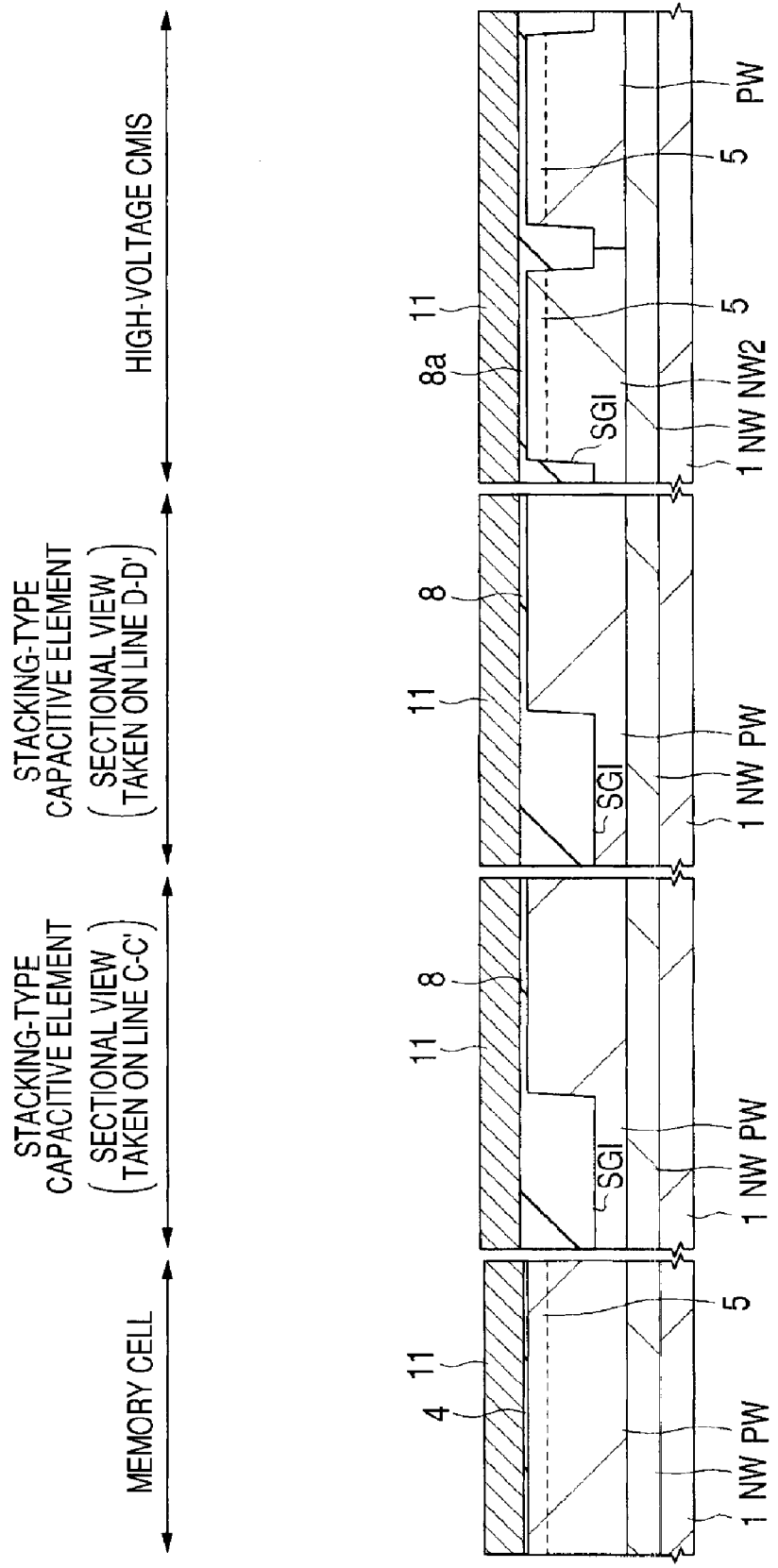
FIG. 13 is a sectional view of the principal parts of the same spots as shown in FIG. 10, in the semiconductor substrate, during a step following the step of manufacturing the microcomputer with the MONOS nonvolatile memory, mounted therein, as shown in FIG. 12.

Next, as shown in FIG. 13, a first conductor film 11 comprised of a polycrystalline silicon film having impurity concentration in a range of, for example, $1 \times 10^{20}$ to $1 \times 10^{21}$ cm$^{-3}$ is deposited over the principal surface of the semiconductor substrate 1. The first conductor film 11 is formed by a CVD (Chemical Vapor Deposition) method to a thickness of, for example, 0.25 µm.

Figure 14:
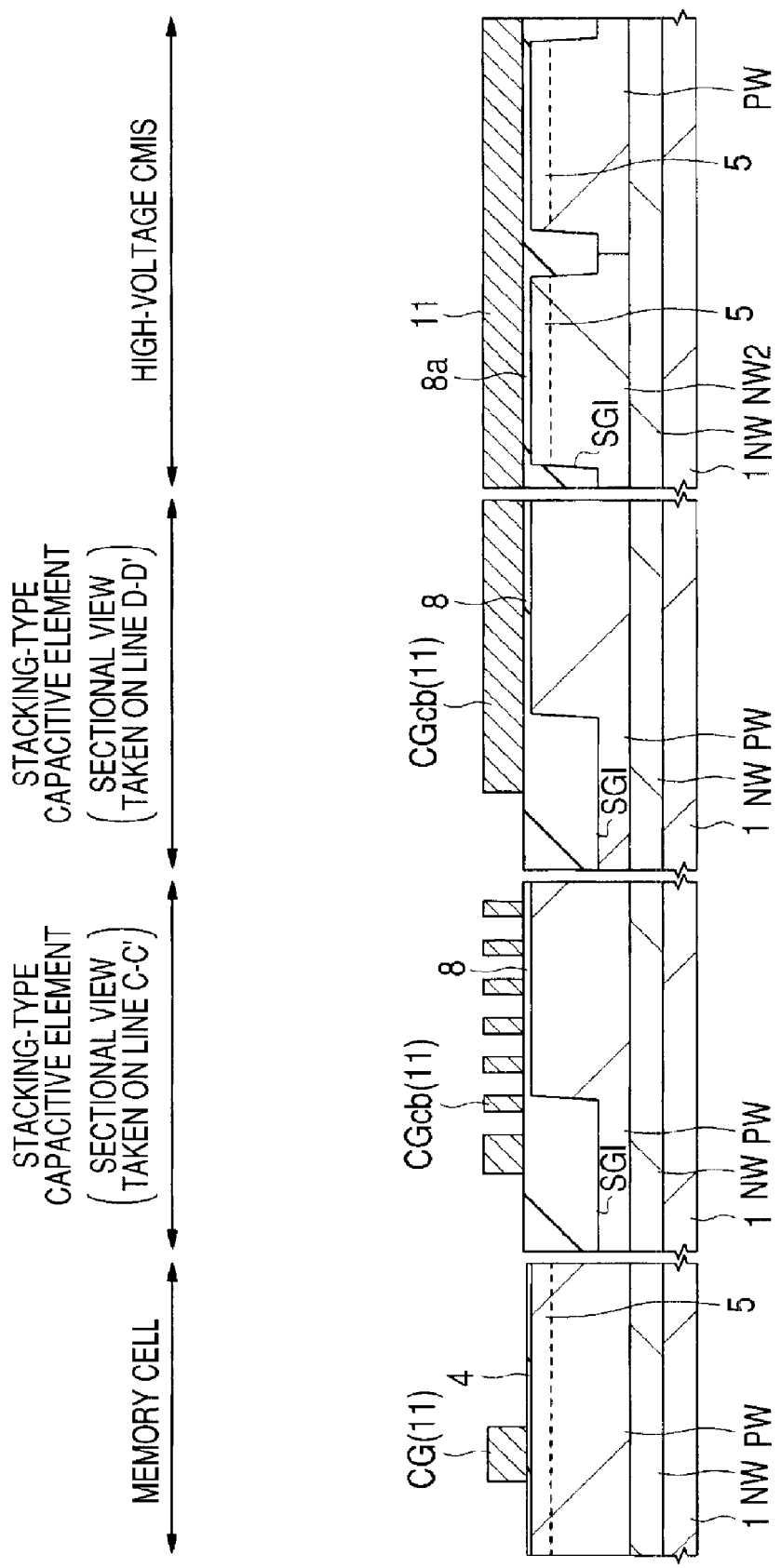
FIG. 14 is a sectional view of the principal parts of the same spots as shown in FIG. 10, in the semiconductor substrate, during a step following the step of manufacturing the microcomputer with the MONOS nonvolatile memory, mounted therein, as shown in FIG. 13.

Next, as shown in FIG. 14, by working on the first conductor film 11 with a resist pattern used as a mask, the select gate electrode CG is formed in the memory cell forming region, and the lower electrode CGcb is formed in the stacking-type capacitive element forming region. The select gate electrode CG has a gate length in a range of, for example, 0.1 to 0.2 µm. At this point in time, the lower electrode CGcb in the stacking-type capacitive element forming region is provided with a plurality of the grooves so as to be patterned as shown in FIG. 2 (a).

Figure 15:
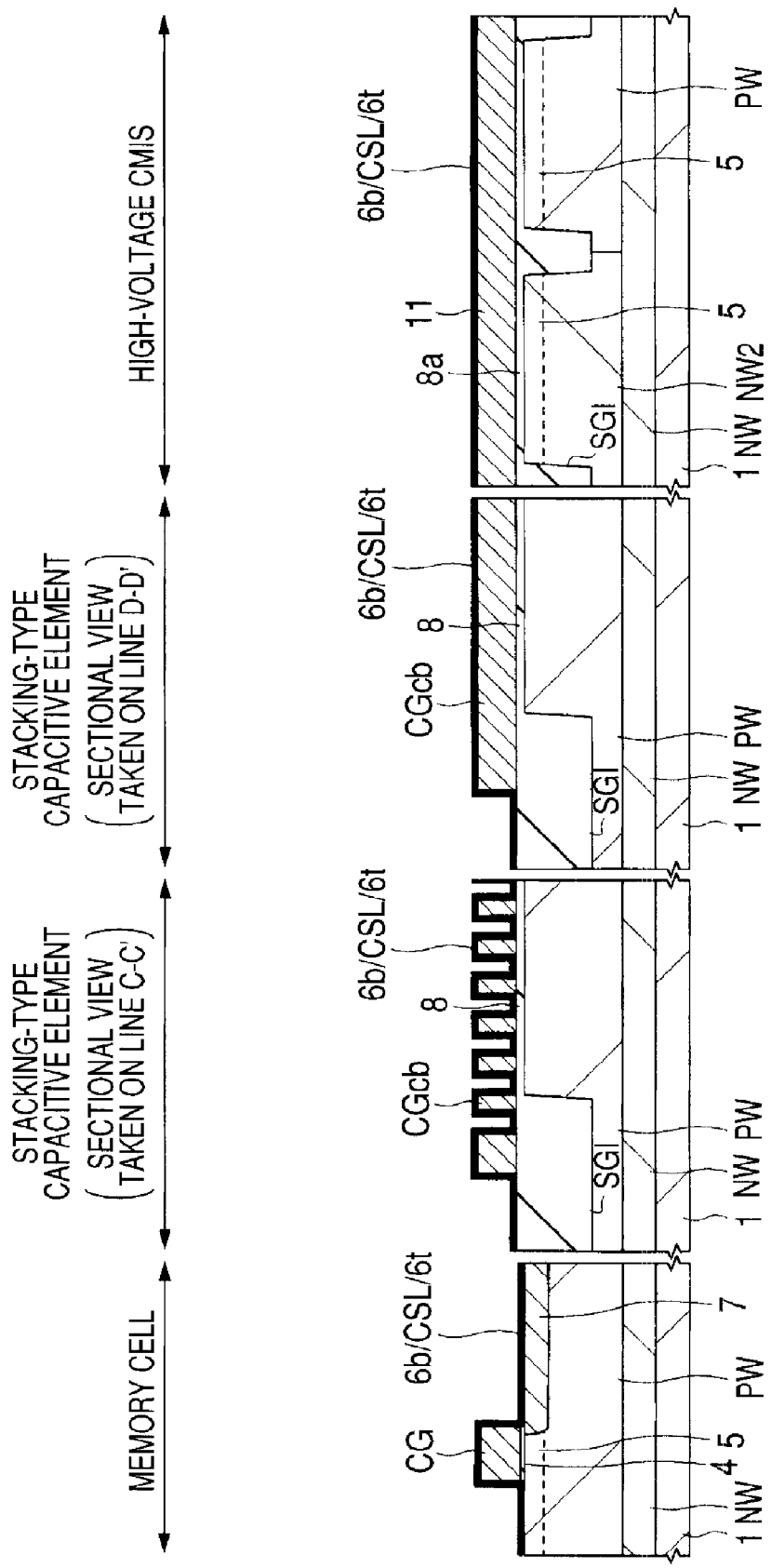
FIG. 15 is a sectional view of the principal parts of the same spots as shown in FIG. 10, in the semiconductor substrate, during a step following the step of manufacturing the microcomputer with the MONOS nonvolatile memory, mounted therein, as shown in FIG. 14.

Next, as shown in FIG. 15, the semiconductor region 7 for forming the channel of the memory nMIS (Qnm) is formed in a portion of the principal surface of the semiconductor substrate 1, in the memory cell forming region.

Subsequently, the insulating film 6b comprised of, for example, a silicon oxide film, the charge storage layer CSL comprised of, for example, a silicon nitride film, and the insulating film 6t comprised of, for example, a silicon oxide film are sequentially deposited over the principal surface of the semiconductor substrate 1. The insulating film 6b is formed by a thermal oxidation method to a thickness in a range of, for example, 1 to 10 nm, the charge storage layer CSL is formed by the CVD method to a thickness in a range of, for example, 5 to 20 nm, and the insulating film 6t is formed by the CVD method to a thickness in a range of, for example, 5 to 15 nm. Accordingly, the aggregate thickness of the insulating films 6b, 6t, and the charge storage layer CSL is in a range of, for example, 11 to 45 nm. The insulating films 6b, and 6t, together with and the charge storage layer CSL, provides a function as the gate insulating film of the memory nMIS (Qnm) to be formed later, in addition to a charge conservation function. Since constituents of the respective films (the insulating film 6b, the charge storage layer CSL, and the insulating film 6t) configuring the insulating films 6b, 6t, and the charge storage layer CSL will vary depending on a method for application of a semiconductor device to be manufactured, only typical constituents, and values are illustrated herein by way of example. However, it is to be understood that the invention be not limited thereto.

Further, the insulating films 6b, 6t, and the charge storage layer CSL, in the stacking-type capacitive element forming region, are formed in order to ensure voltage resistance between the upper electrode MGct and the lower electrode CGcb. That is, the charge storage layer CSL, in the stacking-type capacitive element forming region, is not an insulating film having the charge conservation function, but an insulating film formed for the purpose of ensuring the voltage resistance. Accordingly, a stacked film comprised of the insulating films 6b, 6t, and the charge storage layer CSL is not necessarily needed, but a single-layer insulating film may suffice. More specifically, an insulating film having a film thickness sufficient to ensure the voltage resistance maybe formed. However, with the present embodiment of the invention, the insulating films 6b, 6t, and the charge storage layer CSL are formed in the same step where the memory cell MC1 is formed, thereby gaining merits of simplifying a manufacturing process.

Figure 16:
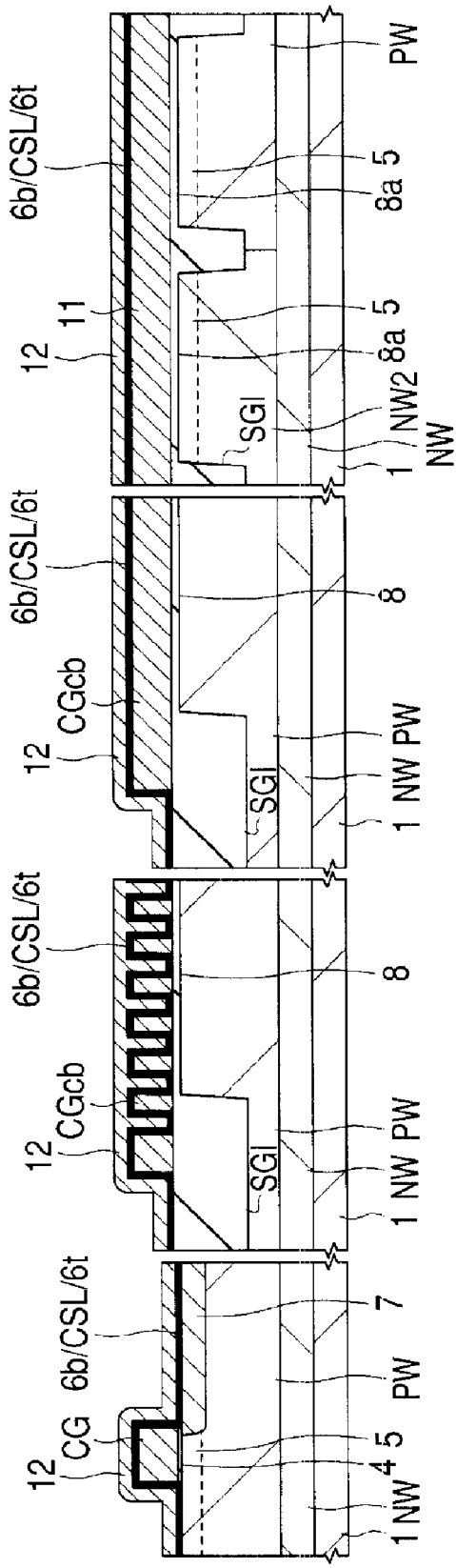
FIG. 16 is a sectional view of the principal parts of the same spots as shown in FIG. 10, in the semiconductor substrate, during a step following the step of manufacturing the microcomputer with the MONOS nonvolatile memory, mounted therein, as shown in FIG. 15.

Next, as shown in FIG. 16, a second conductor film 12 comprised of a polycrystalline silicon film having impurity concentration in a range of, for example, $1 \times 10^{20}$ to $1 \times 10^{21}$ $cm^{-3}$ is deposited over the principal surface of the semiconductor substrate 1. The second conductor film 12 is formed by the CVD method to a thickness of, for example, 80 nm. After this step of processing, respective interiors of the plural grooves provided in the lower electrode CGcb, in the stacking-type capacitive element forming region, are filled up with respective portions of the insulating films (the insulating films 6b, 6t, and the charge storage layer CSL), and portions of the second conductor film 12.

Figure 17:
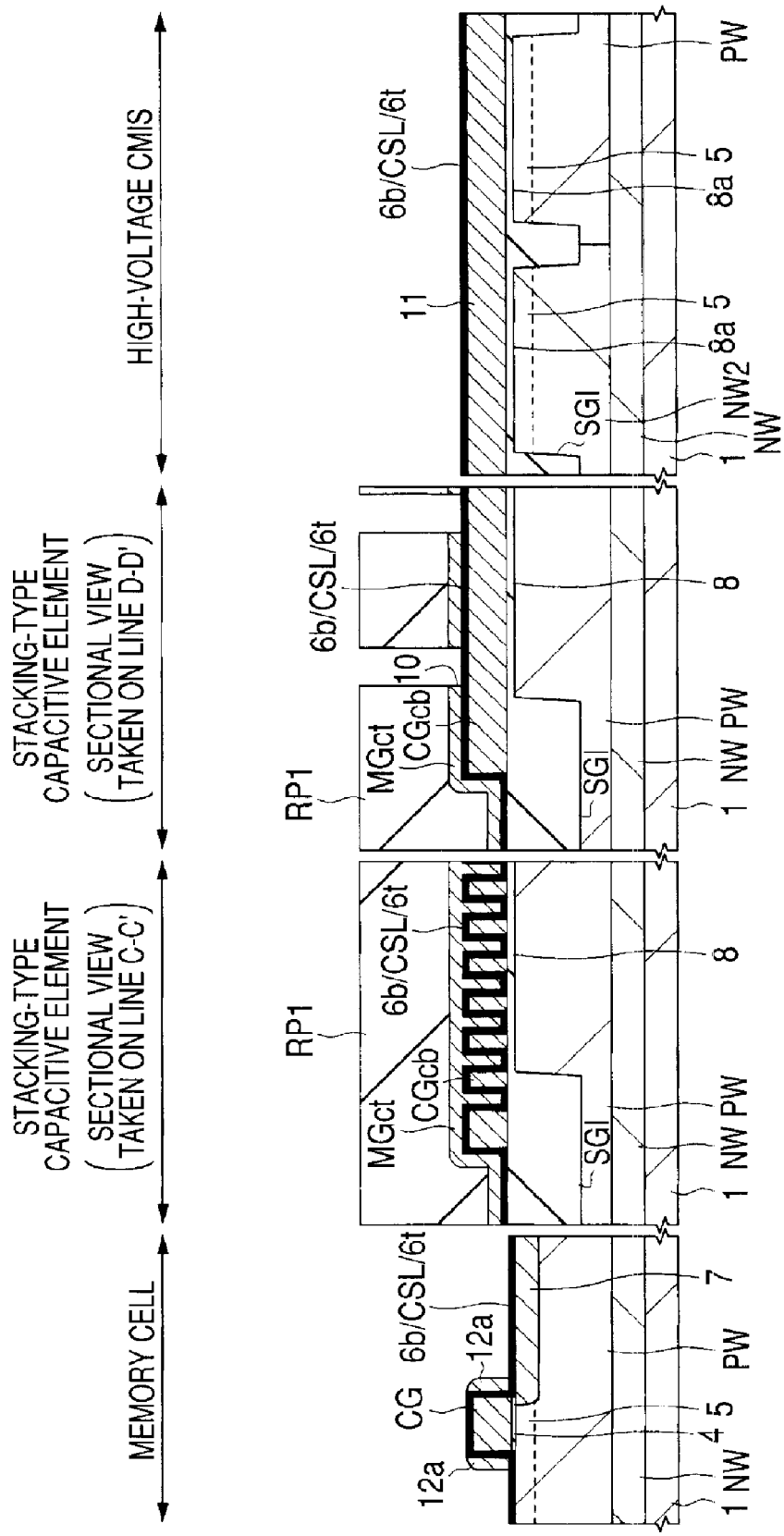
FIG. 17 is a sectional view of the principal parts of the same spots as shown in FIG. 10, in the semiconductor substrate, during a step following the step of manufacturing the microcomputer with the MONOS nonvolatile memory, mounted therein, as shown in FIG. 16.

Next, as shown in FIG. 17, by providing openings at predetermined spots (respective spots where the openings are to be formed in the lower electrode CGcb, later,) without covering the memory cell forming region, and the region for forming the high-voltage CMIS of the peripheral circuit, a resist pattern RP1 covering the stacking-type capacitive element forming region is formed. Subsequently, the second conductor film 12 is etched back by an anisotropic dry etching method using the resist pattern RP1 as a mask, thereby forming a sidewall 12a comprised of the second conductor film 12 on both sides of the select gate electrode CG in the memory cell forming region through the intermediary of the insulating films 6b, 6t, and the charge storage layer CSL, forming the upper electrode MGct comprised of the second conductor film 12 in the stacking-type capacitive element forming region, forming the openings 10 in the upper electrode MGct, and removing the second conductor film 12 in the region for forming the high-voltage CMIS of the peripheral circuit. Further, in this step of processing, the second conductor film 12 is worked on using the resist pattern RP1 as the mask to thereby form the outlet in a region where the contact hole to be connected to the memory gate electrode MG is formed later. Further, the second conductor film 12 is etched back in the memory cell forming region with the use of the insulating film 6t as an etching stopper layer, however, in order to prevent the insulating film 6t, and the charge storage layer CSL underneath the insulating film 6t from being damaged, and impaired, due to etching back, a low-damage etching back condition is preferably set. If the insulating film 6t, and the charge storage layer CSL are damaged, this will cause deterioration in the characteristics of the memory cell such as deterioration in charge conservation characteristic.

Figure 18:
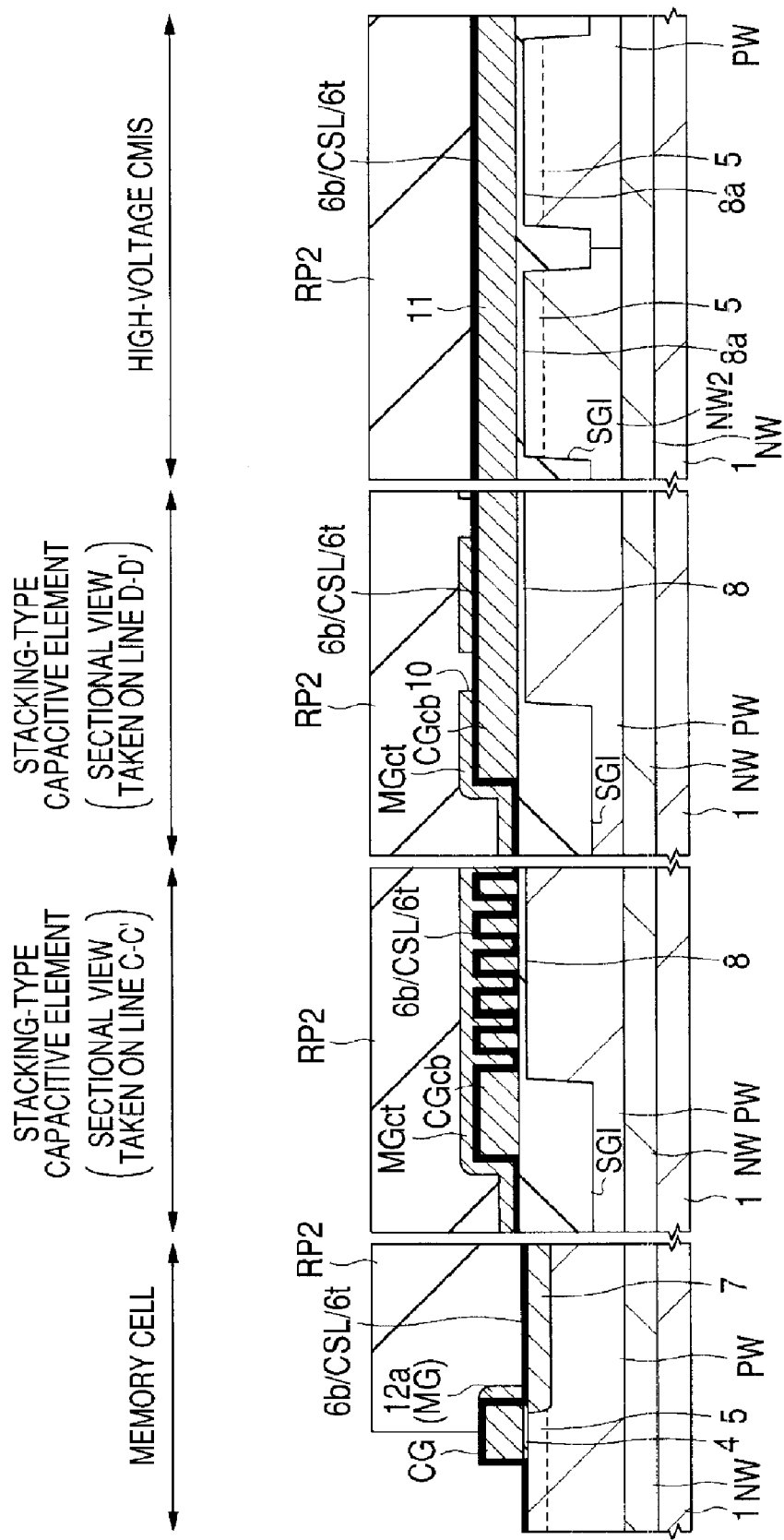
FIG. 18 is a sectional view of the principal parts of the same spots as shown in FIG. 10, in the semiconductor substrate, during a step following the step of manufacturing the microcomputer with the MONOS nonvolatile memory, mounted therein, as shown in FIG. 17.

Next, as shown in FIG. 18, with the use of a resist pattern RP2 as a mask, the sidewall 12a exposed out of the mask is etched, thereby forming the memory gate electrode MG comprised of the sidewall 12a, only on one side of the sidewalls of the select gate electrode CG, in the memory cell forming region. The memory gate electrode MG has the gate length of, for example, in the range of 0.05 to 0.15 μm.

Since the gate length of the memory gate electrode MG is dependent on a deposition film-thickness of the second conductor film 12, the gate length of the memory gate electrode MG is adjusted by adjusting the deposition film-thickness of the second conductor film 12. If, for example, the deposition film-thickness of the second conductor film 12 is decreased, this will enable the gate length of the memory gate electrode MG to be rendered shorter, and if the deposition film-thickness of the second conductor film 12 is increased, this will enable the gate length of the memory gate electrode MG to be rendered longer.

Figure 19:
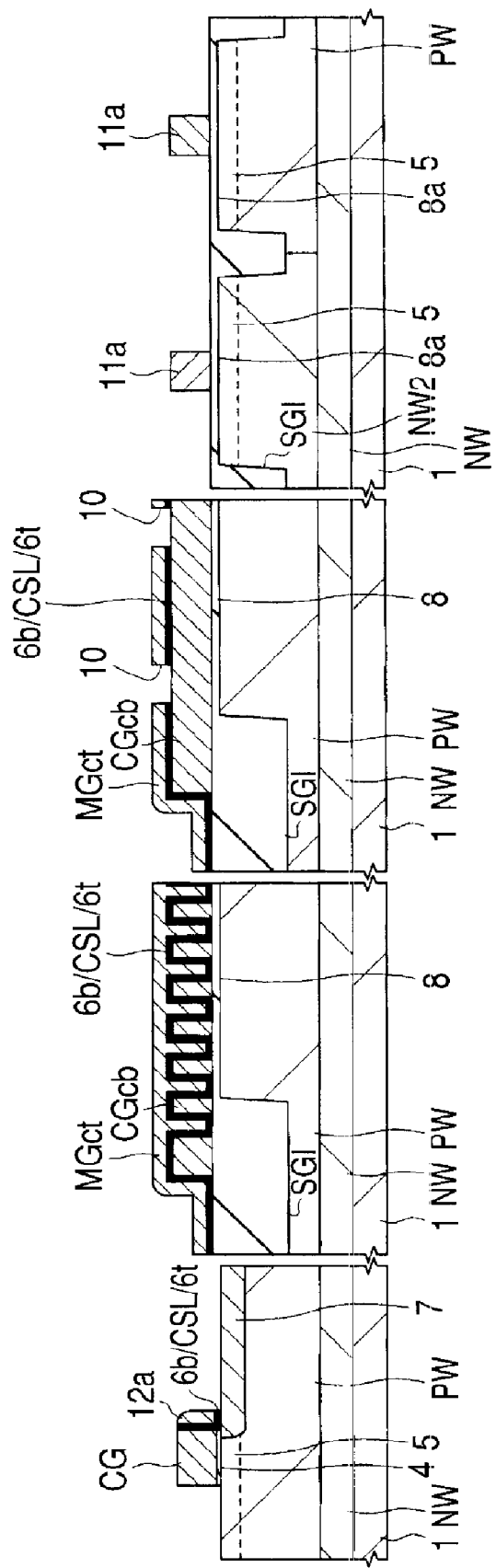
FIG. 19 is a sectional view of the principal parts of the same spots as shown in FIG. 10, in the semiconductor substrate, during a step following the step of manufacturing the microcomputer with the MONOS nonvolatile memory, mounted therein, as shown in FIG. 18.

Next, as shown in FIG. 19, after removing exposed portions of the insulating films 6b, 6t, and the charge storage layer CSL, respectively, the first conductor film 11 in the region for forming the high-voltage CMIS of the peripheral circuit is worked on using a resist pattern as a mask, thereby forming respective gate electrodes 11a of an nMIS, and a pMIS of the high-voltage CMIS of the peripheral circuit.

Figure 20:
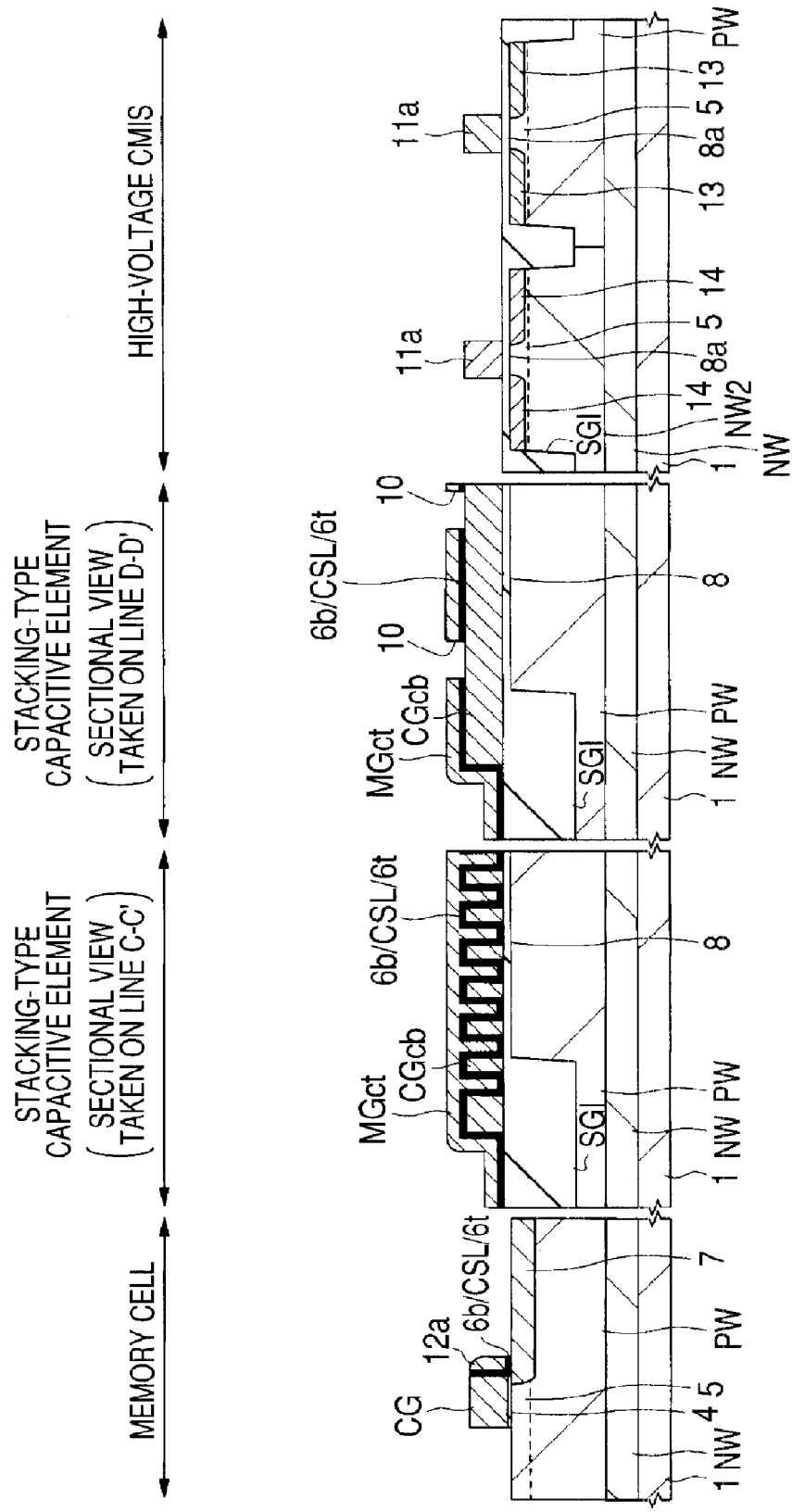
FIG. 20 is a sectional view of the principal parts of the same spots as shown in FIG. 10, in the semiconductor substrate, during a step following the step of manufacturing the microcomputer with the MONOS nonvolatile memory, mounted therein, as shown in FIG. 19.

Next, as shown in FIG. 20, ion implantation of an n-type impurities, for example, arsenic is applied to the principal surface of the semiconductor substrate 1 with the use of a resist pattern as a mask, thereby forming n⁻type semiconductor regions 13, 13 of the nMIS in a self aligning fashion against the gate electrode 11a in a portion of the principal surface of the semiconductor substrate 1, in the region for forming the high-voltage CMIS of the peripheral circuit. Similarly, ion implantation of a p-type impurities, for example, boron fluoride is applied to the principal surface of the semiconductor substrate 1 with the use of the resist pattern as the mask, thereby forming p type semiconductor regions 14, 14 of the pMIS in a self aligning fashion against the gate electrode 11a, in the portion of the principal surface of the semiconductor substrate 1, in the region for forming the high-voltage CMIS of the peripheral circuit.

Figure 21:
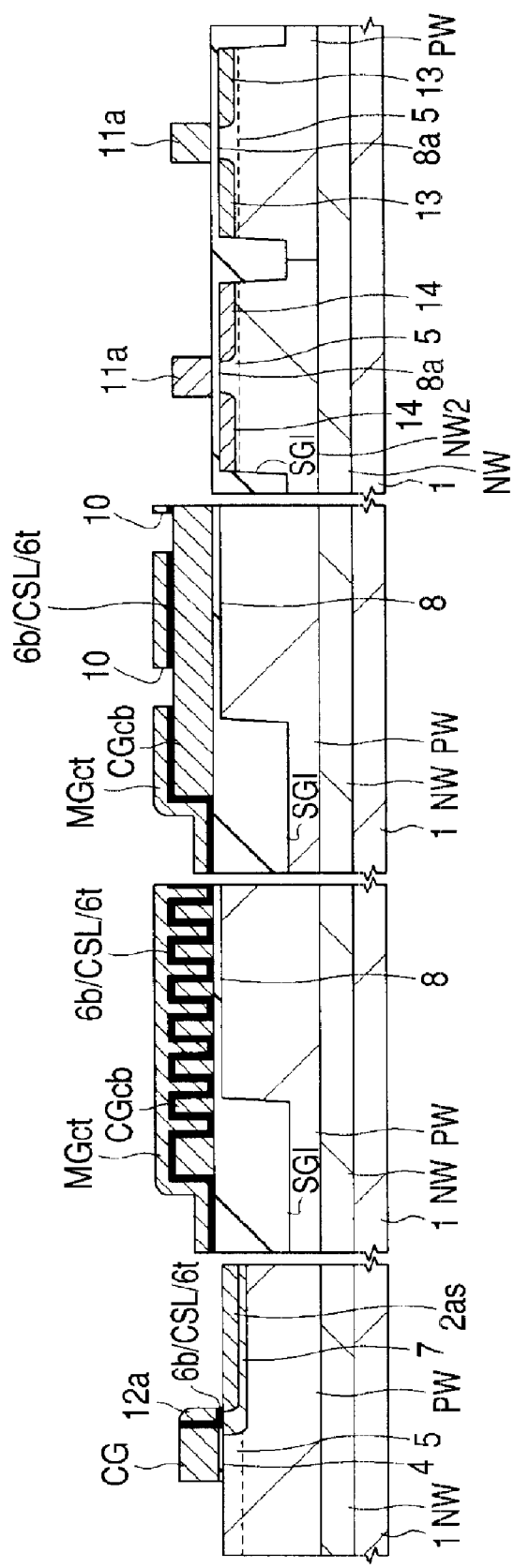
FIG. 21 is a sectional view of the principal parts of the same spots as shown in FIG. 10, in the semiconductor substrate, during a step following the step of manufacturing the microcomputer with the MONOS nonvolatile memory, mounted therein, as shown in FIG. 20.

Next, as shown in FIG. 21, after forming a resist pattern (not shown), an end thereof being positioned on the upper surface of the select gate electrode CG, and covering part of the select gate electrode CG, on a side thereof, opposite from the memory gate electrode MG, ion implantation of the n-type impurities, for example, arsenic is applied to the principal surface of the semiconductor substrate 1, using the select gate electrode CG, the memory gate electrode MG, and the resist pattern as a mask, thereby forming the n⁻type semiconductor region 2as in a self aligning fashion against the memory gate electrode MG, in the principal surface of the semiconductor substrate 1.

Figure 22:
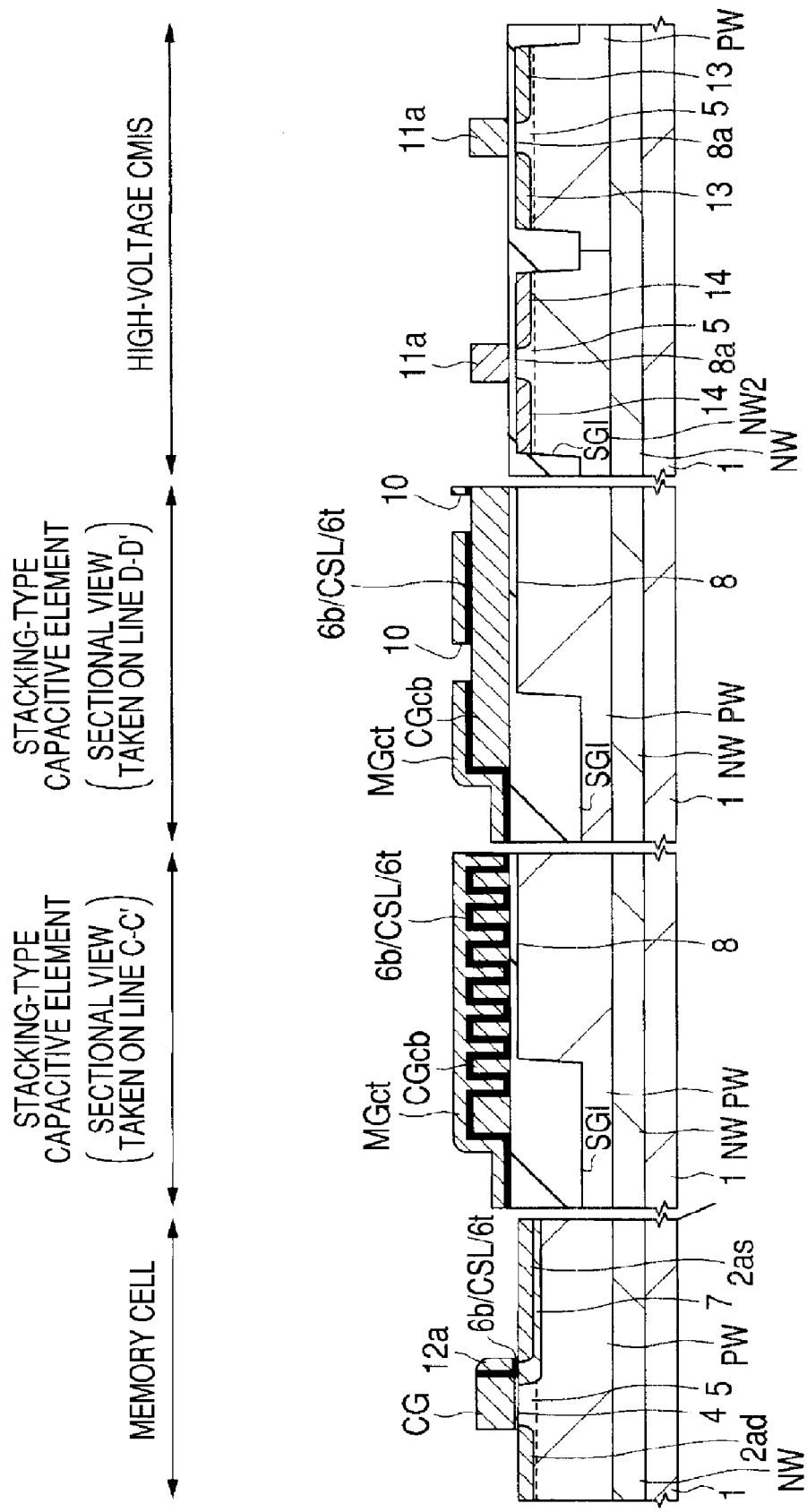
FIG. 22 is a sectional view of the principal parts of the same spots as shown in FIG. 10, in the semiconductor substrate, during a step following the step of manufacturing the microcomputer with the MONOS nonvolatile memory, mounted therein, as shown in FIG. 21.

Next, as shown in FIG. 22, after forming a resist pattern (not shown), an end thereof being positioned on the upper surface of the select gate electrode CG, and covering a part of the select gate electrode CG, on a side thereof, adjacent to the memory gate electrode MG, ion implantation of the n-type impurities, for example, arsenic is applied to the principal surface of the semiconductor substrate 1, using the select gate electrode CG, the memory gate electrode MG, and the resist pattern as a mask, thereby forming the n⁻type semiconductor region 2ad in the principal surface of the semiconductor substrate 1, in a self aligning fashion against the select gate electrode CG.

In this case, the n⁻type semiconductor region 2as is first formed, and subsequently, the n⁻type semiconductor region 2ad is formed, however, the n⁻type semiconductor region 2ad may be first formed, and subsequently, the n⁻type semiconductor region 2as may be formed, or the n⁻type semiconductor regions 2as, 2ad may be concurrently formed. Further, subsequently to the ion implantation of the n-type impurities for forming the n⁻type semiconductor region 2ad, the p-type semiconductor region may be formed in such a way as to surround respective lower parts of the n⁻type semiconductor regions 2as, 2ad by applying the ion implantation of the p-type impurities, for example, boron to the principal surface of the semiconductor substrate 1.

Figure 23:
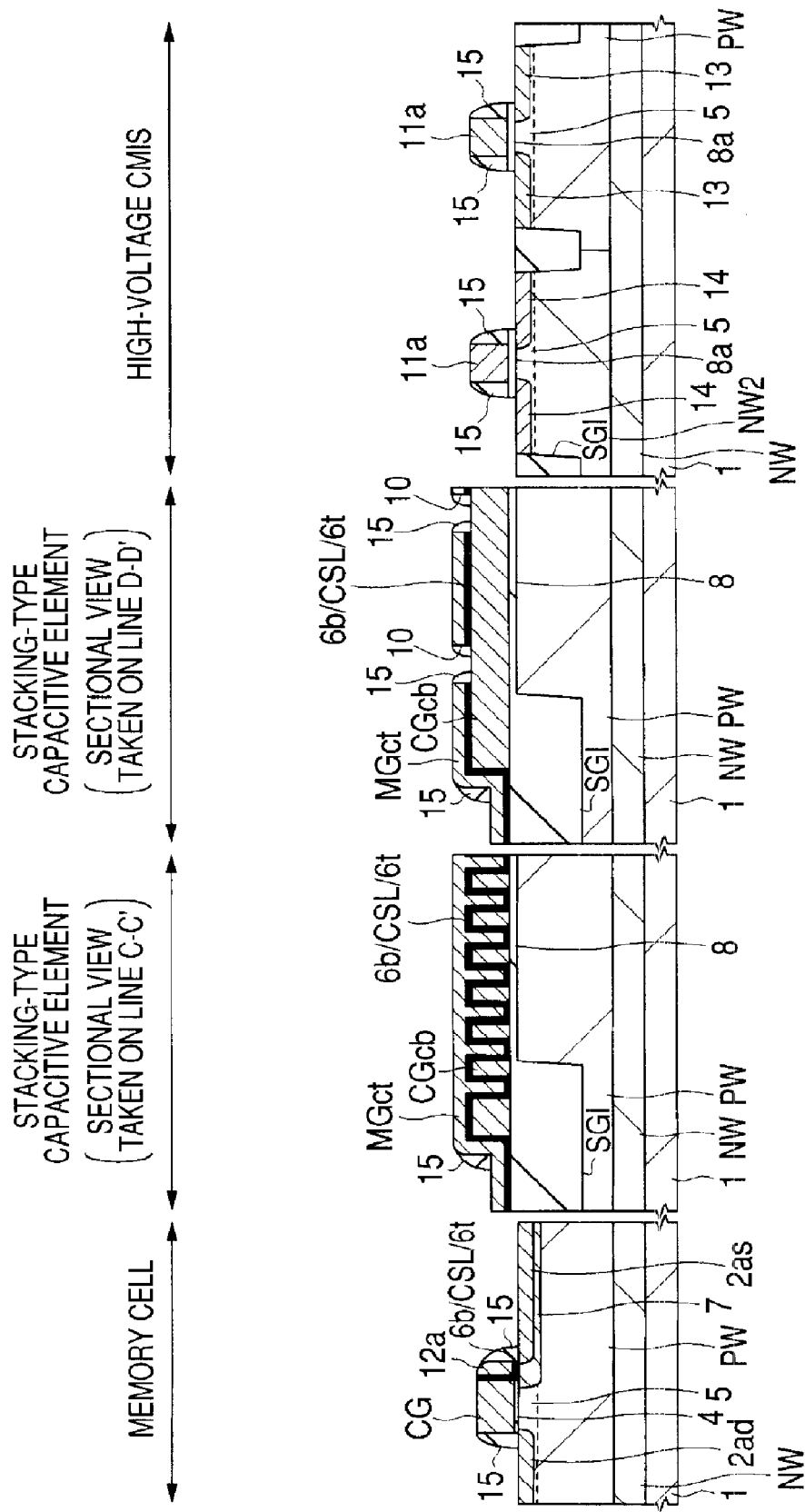
FIG. 23 is a sectional view of the principal parts of the same spots as shown in FIG. 10, in the semiconductor substrate, during a step following the step of manufacturing the microcomputer with the MONOS nonvolatile memory, mounted therein, as shown in FIG. 22.

Next, as shown in FIG. 23, after depositing an insulating film 0.08 μm thick, comprised of, for example, a silicon oxide film, on the principal surface of the semiconductor substrate 1 by use of a plasma CVD method, the insulating film is etched back by an anisotropic dry etching method, thereby forming a sidewall 15 on one flank of the select gate electrode CG, and on one flank of the memory gate electrode MG, in the memory cell forming region, on flanks of the upper electrode MGct in the stacking-type capacitive element forming region, and flanks of the respective gate electrodes 11a of the nMIS, and the pMIS, in the region for forming the high-voltage CMIS of the peripheral circuit. The sidewall 15 has a spacer length of, for example, 0.06 μm. As a result, in the memory cell forming region, an exposed flank of the gate insulting film 4 between the select gate electrode CG and the principal surface of the semiconductor substrate 1, and respective exposed flanks of the insulating films 6b, 6t, and charge storage layer CSL, between the memory gate electrode MG and the principal surface of the semiconductor substrate 1 can be covered with the sidewall 15.

Figure 24:
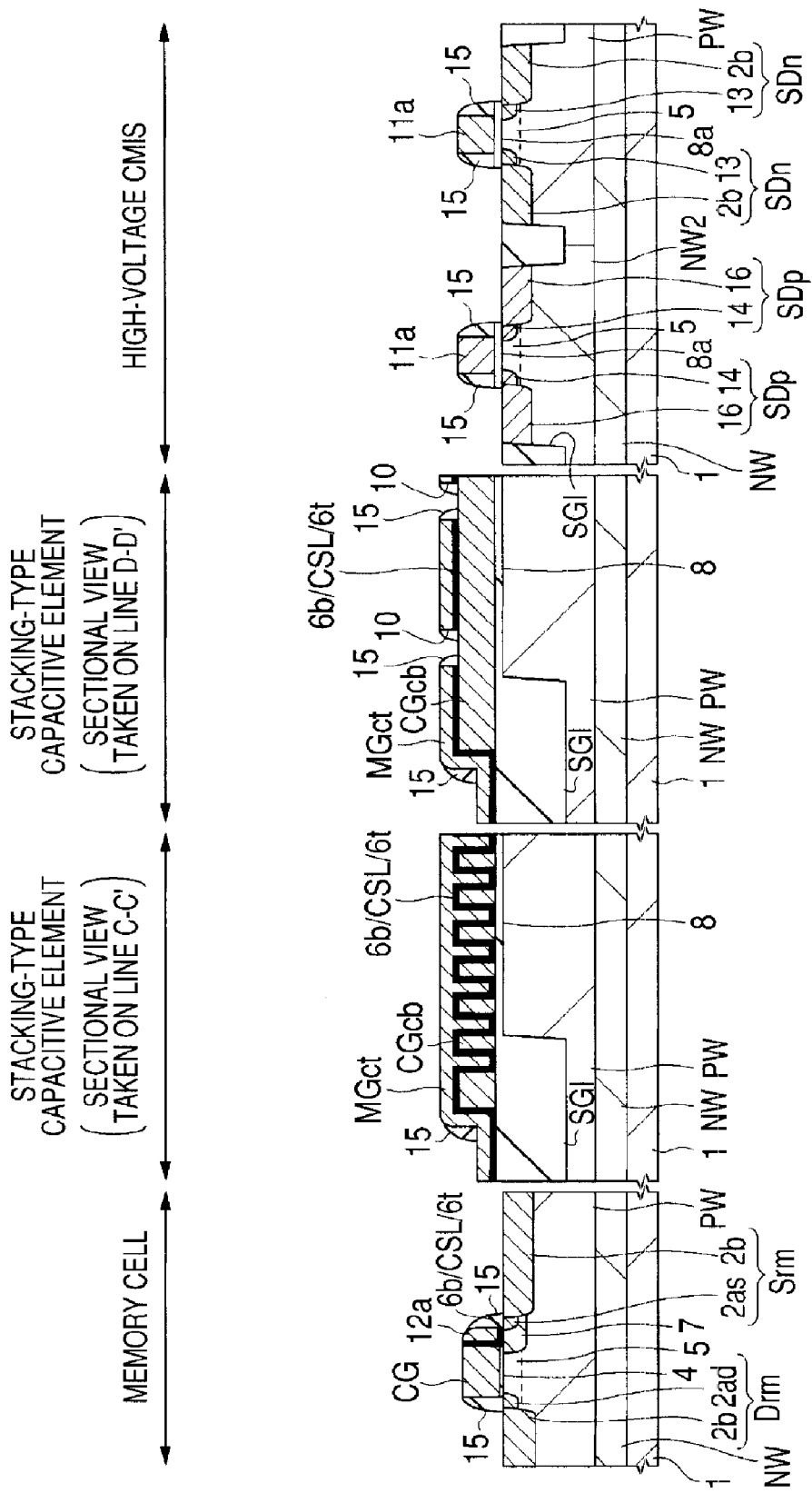
FIG. 24 is a sectional view of the principal parts of the same spots as shown in FIG. 10, in the semiconductor substrate, during a step following the step of manufacturing the microcomputer with the MONOS nonvolatile memory, mounted therein, as shown in FIG. 23.

Next, as shown in FIG. 24, by applying ion implantation of n-type impurities, for example, arsenic, or phosphorus to the portion of the principal surface of the semiconductor substrate 1, in the memory cell forming region, with the use of a resist pattern, and the sidewall 15 as a mask, the n⁺type semiconductor region 2b is formed in a self aligning fashion against the select gate electrode CG, and the memory gate electrode MG, in the portion of the principal surface of the semiconductor substrate 1 in the memory cell forming region. Concurrently, the n⁺type semiconductor regions 2b are formed in the self aligning fashion against the respective gate electrodes 11a, in the portion of the principal surface of the semiconductor substrate 1, in the region for forming the high-voltage CMIS of the peripheral circuit (the nMIS forming region). By so doing, the source region Srm comprised of the n⁻type semiconductor region 2ad, and the n⁺type semiconductor region 2b, and the drain region Drm comprised of the n⁻type semiconductor region 2as, and the n⁺type semiconductor region 2b are formed in the memory cell forming region. Concurrently, a source-drain region SDn comprised of an n⁻type region 13, and the n⁺type semiconductor region 2b is formed in the region for forming the high-voltage CMIS of the peripheral circuit (the nMIS forming region).

Similarly, by applying the ion implantation of the p-type impurities, for example, boron fluoride to the portion of the principal surface of the semiconductor substrate 1, in the region for forming the high-voltage CMIS of the peripheral circuit (the pMIS forming region), with the use of the resist pattern and the sidewall 15 as the mask, thereby forming p⁺type semiconductor regions 16, 16 in a self aligning fashion against the respective gate electrodes 11a. By so doing, the source-drain region SDp comprised of a p⁻type region 14, and the p⁺type semiconductor region 16 is formed in the region for forming the high-voltage CMIS of the peripheral circuit (the pMIS forming region).

Figure 25:
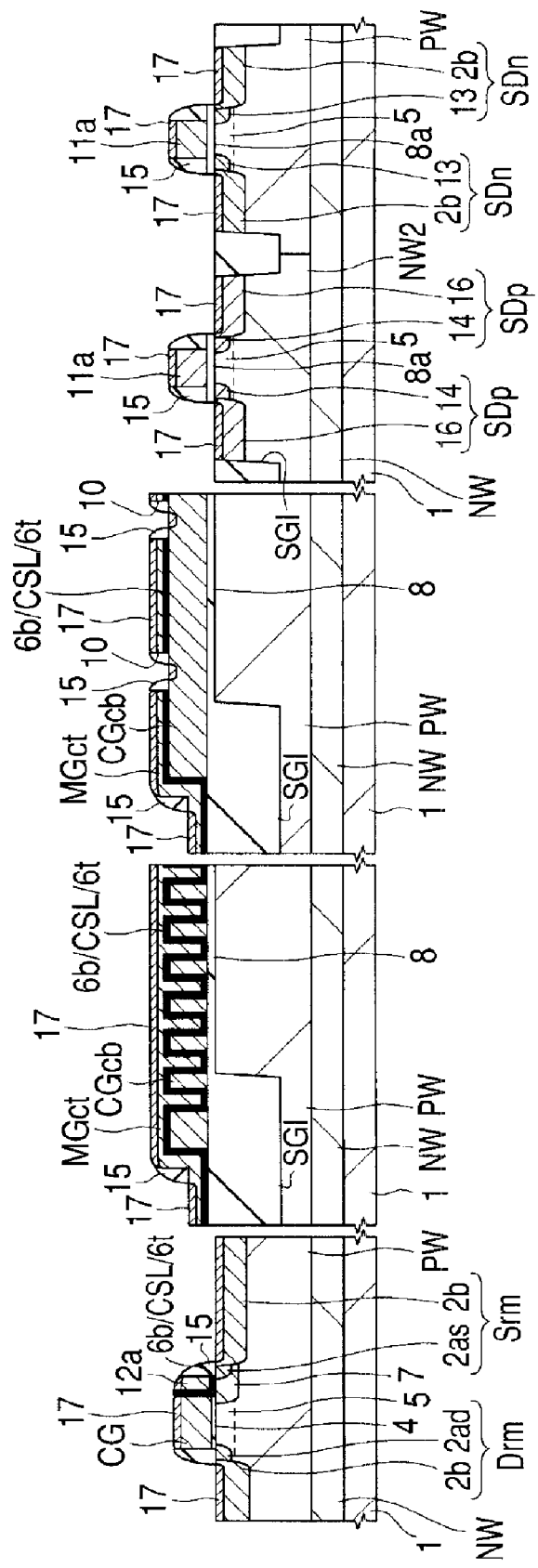
FIG. 25 is a sectional view of the principal parts of the same spots as shown in FIG. 10, in the semiconductor substrate, during a step following the step of manufacturing the microcomputer with the MONOS nonvolatile memory, mounted therein, as shown in FIG. 24.

Next, as shown in FIG. 25, for example, a cobalt silicide ($CoSi_2$) layer 17 is formed over the respective upper surfaces of the select gate electrode CG, the memory gate electrode MG, and the n⁺type semiconductor regions 2b, in the memory cell forming region, the upper surface of the upper electrode MGct, the upper surface of a portion of the lower electrode CGcb, exposed to the bottom of each of the openings 10, in the stacking-type capacitive element forming region, and the respective upper surfaces of the gate electrodes 11a, the n⁺type semiconductor regions 2b, and the p⁺type semiconductor regions 16, in the region for forming the high-voltage CMIS of the peripheral circuit by use of a self-alignment method, such as, for example, Salicide (Salicide: Self Align silicide) process.

First, a cobalt film is deposited on the principal surface of the semiconductor substrate 1 by use of a sputtering method. Subsequently, by applying heat treatment using an RTA (Rapid Thermal Anneal) method to the semiconductor substrate 1, the cobalt film is caused to react with the polycrystalline silicon film (the first conductor film 11 or the second conductor film 12) forming the select gate electrode CG or the memory gate electrode MG, and silicon (the n⁺type semiconductor region 2b) forming the semiconductor substrate 1, in the memory cell forming region, the cobalt film is caused to react with the polycrystalline silicon film (the first conductor film 11 or the second conductor film 12) forming the lower electrode CGcb or the upper electrode MGct, in the stacking-type capacitive element forming region, and the cobalt film is caused to react with the polycrystalline silicon film (the first conductor film 11) forming the respective gate electrodes 11a, and the silicon (the n⁺type semiconductor region 2b or the p⁺type semiconductor regions 16) forming the semiconductor substrate 1, in the region for forming the high-voltage CMIS of the peripheral circuit, thereby forming the cobalt silicide layer 17. Thereafter, portions of the cobalt film, not reacted as yet, are removed. By forming the cobalt silicide layer 17, contact resistance between the cobalt silicide layer 17, and the plug to be formed in an upper part thereof, and so forth, can be reduced, and respective resistances of the select gate electrode CG, the memory gate electrode MG, the source region Srm, and the drain region Drm, themselves, can be reduced in the memory cell forming region while resistance of the upper electrode MGct itself can be reduced in the stacking-type capacitive element forming region, and respective resistances of the gate electrodes 11a, the source-rain region SDn, and the source-drain region SDp, themselves, can be reduced in the region for forming the high-voltage CMIS of the peripheral circuit.

Figure 26:
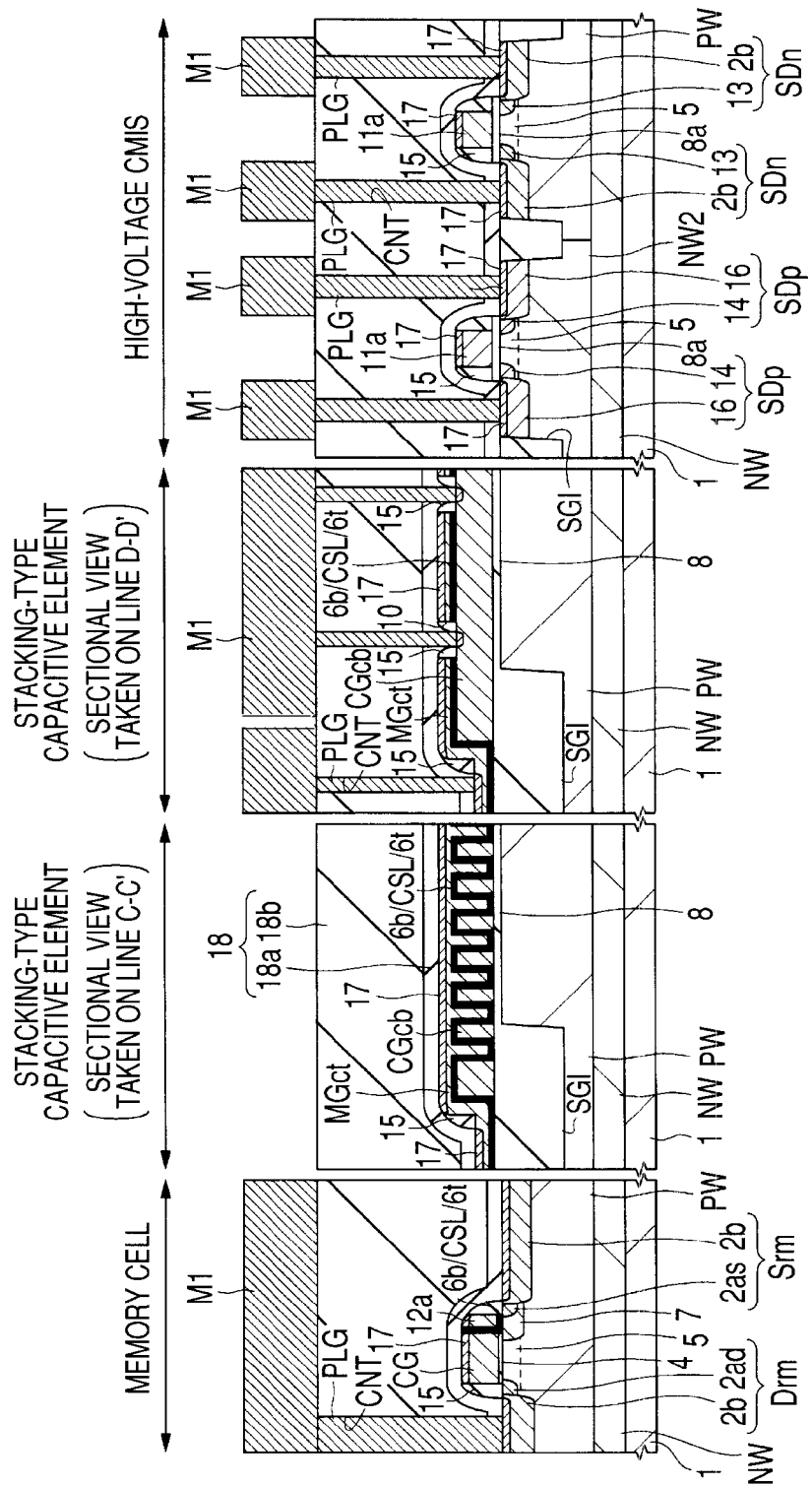
FIG. 26 is a sectional view of the principal parts of the same spots as shown in FIG. 10, in the semiconductor substrate, during a step following the step of manufacturing the microcomputer with the MONOS nonvolatile memory, mounted therein, as shown in FIG. 25.

Next, as shown in FIG. 26, interlayer dielectric 18 comprised of, for example, a silicon nitride film 18a, and a silicon oxide film 18b is formed over the principal surface of the semiconductor substrate 1 by the CVD method. After subsequent formation of the contact holes CNT in the interlayer dielectric 18, the PLG is formed in each of the contact holes CNT. The PLG has a relatively thin barrier film comprised of a stacked film of, for example, titanium and titanium nitride, and a relatively thick conductor film comprised of tungsten, or aluminum, and so forth, formed in such a way as to be enveloped by the barrier film. Thereafter, the first layer interconnection M1 comprised of, for example, tungsten, or aluminum, copper, or so forth is formed over the interlayer dielectric 18, thereby substantially completing the microcomputer with the MONOS nonvolatile memory, mounted therein. The semiconductor device is manufactured through common process steps of manufacturing a semiconductor device, to be taken hereafter.

Having specifically described the invention developed by the inventor, et al, on the basis of the embodiments thereof, as described in the foregoing, it is obvious that the invention be not limited thereto, and that various changes and modifications may be made therein without departing from the spirit and scope thereof.

To give an example, with the embodiments of the invention, use is made of the split-gate MONOS memory cell wherein the memory gate electrode of the memory nMIS is formed of the sidewall, however, the invention is not limited thereto. For example, use may be made of the split-gate MONOS memory cell wherein the select gate electrode of the select nMIS is formed of the sidewall, in which case, the first capacitive insulating film is comprised of the insulating film in the same layer as the charge storage layer, the lower electrode is comprised of the conductor film in the same layer as the memory gate electrode of the memory nMIS, the second capacitive insulating film is comprised of the insulating film in the same layer as the gate insulating film of the high-voltage CMIS of the peripheral circuit, and the upper electrode is comprised of the conductor film in the same layer as the select gate electrode of the select nMIS.

Further, with the embodiments of the invention, described in the foregoing, the first capacitive insulating film is formed of the insulating film in the same layer as the gate insulating film of the high-voltage CMIS of the peripheral circuit, however, the invention is not limited thereto, and the first capacitive insulating film may be formed of an insulating film in the same layer as a gate insulating film of other type CMIS such as, for example, an intermediate-voltage CMIS of the peripheral circuit.

Still further, with the embodiments of the invention, described in the foregoing, there is illustrated an example where the lower electrode is in the planar shape of the grid, however, the lower electrode can be formed in other shapes. For example, a lower electrode may be formed such that a conductor film of the lower electrode is divided into a plurality of lengths, and respective lower electrode electrodes, linear in shape, are arranged in the shape of stripes. In the case where the respective lower electrode electrodes are arranged in the shape of the stripes, it is possible to render height, and width thereof, and an interval therebetween, identical to those in the case of the lower electrode being in the planar shape of the grid. The respective lower electrode electrodes have the same configuration in other respects as that for the case of the lower electrode in the planar shape of the grid.

Yet further, with the embodiments of the invention, described in the foregoing, it is described that the stacking-type capacitive element comprises the two capacitors (the first and second capacitors) that are parallel-coupled, as shown in FIG. 2 (b), however, the two capacitors may be series-coupled to each other for use. If the first capacitor is series-coupled to the second capacitor, capacitance of the capacitive element in whole will be smaller as compared with the case of parallel-coupling, but reliability of the capacitive element can be enhanced. More specifically, since an applied voltage is divided, a voltage applied to each of the insulating films is lowered, thereby enabling a TDDB (Time-Dependent Dielectric Breakdown) life to be enhanced. In this connection, it is possible to implement series-coupling by changing a method for connecting interconnections such as the first layer interconnection M1, and so forth with the configuration of the capacitive element being kept the same as that in the case of the embodiments described in the foregoing.

This invention can be applied to a semiconductor device having a capacitive element formed over a semiconductor substrate.

What is claimed is:

1. A semiconductor device having: inter-device separation parts formed in a semiconductor substrate and partitioning an active region of the semiconductor substrate, and a capacitive element formed over the semiconductor substrate,
   the capacitive element comprising:
   a well formed in the active region and configuring a first electrode of the capacitive element;
   a first capacitive insulating film formed over the well;
   a second electrode formed over the first capacitive insulating film;
   a second capacitive insulating film formed over the second electrode; and
   a third electrode formed over the second capacitive insulating film,
   wherein a plurality of grooves, each having a first width in a first direction, are formed in the second electrode,
   wherein a portion of the second capacitive insulating film, and a portion of the third electrode are embedded in the interior of each of the grooves, and
   wherein each of the grooves has a depth greater than an interval between the grooves in the first direction.

2. The semiconductor device according to claim 1, wherein the depth of the each of the grooves is greater than the first width of each of the grooves.

3. The semiconductor device according to claim 1, wherein the grooves each have a second width in a second direction intersecting the first direction, and a planar shape of the second electrode is a grid-like shape.

4. The semiconductor device according to claim 1, wherein a plurality of openings communicating with the second electrode are provided in the third electrode, and an interconnection is coupled to the upper surface of the second electrode via a contact hole provided inside each of the openings.

5. The semiconductor device according to claim 4, wherein a silicide layer is formed over a surface of the second electrode, at the bottom of each of the openings.

* * * * *